United States Patent
Pueschner et al.

(10) Patent No.: US 9,824,983 B2
(45) Date of Patent: Nov. 21, 2017

(54) CHIP CARRIER, A DEVICE AND A METHOD

(71) Applicant: Infineon Technologies AG, Neubiberg (DE)

(72) Inventors: Frank Pueschner, Kelheim (DE); Jens Pohl, Bernhardswald (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/232,815

(22) Filed: Aug. 10, 2016

(65) Prior Publication Data
US 2017/0062358 A1 Mar. 2, 2017

(30) Foreign Application Priority Data
Sep. 2, 2015 (DE) .......... 10 2015 114 645

(51) Int. Cl.
| | | |
|---|---|---|
| H01L 23/00 | (2006.01) | |
| H01L 23/31 | (2006.01) | |
| H01L 23/498 | (2006.01) | |
| H01L 21/48 | (2006.01) | |
| H01L 21/56 | (2006.01) | |

(52) U.S. Cl.
CPC ........ H01L 23/562 (2013.01); H01L 21/4853 (2013.01); H01L 23/4985 (2013.01); H01L 23/49838 (2013.01); H01L 23/49855 (2013.01); H01L 24/16 (2013.01); *H01L 21/563* (2013.01); *H01L 2224/16227* (2013.01)

(58) Field of Classification Search
CPC ... H01L 24/16; H01L 23/49838; H01L 24/05; H01L 2224/16238; H01L 23/481; H01L 23/564; H01L 2224/16235; H01L 23/3135; H01L 23/49833; H01L 23/498; H01L 23/4985; H01L 23/49548; H01L 23/562; H01L 23/5386; H01L 23/5389; H01L 23/49503
See application file for complete search history.

(56) References Cited

U.S. PATENT DOCUMENTS

| | | | |
|---|---|---|---|
| 2004/0129453 A1 | 7/2004 | Boggs et al. | |
| 2005/0104196 A1* | 5/2005 | Kashiwazaki | H01L 23/13 257/706 |
| 2008/0142961 A1* | 6/2008 | Jones | H01L 25/165 257/724 |
| 2008/0179725 A1* | 7/2008 | Chia | H01L 23/13 257/676 |
| 2014/0191257 A1 | 7/2014 | Tischler et al. | |

* cited by examiner

*Primary Examiner* — Jasmine Clark
(74) *Attorney, Agent, or Firm* — Viering, Jentschura & Partner mbB

(57) ABSTRACT

According to various embodiments, a chip carrier may include: a chip supporting region configured to support a chip; a chip contacting region including at least one contact pad for electrically contacting the chip; wherein the chip carrier is thinned in the chip contacting region such that a first thickness of the chip carrier at the at least one contact pad is smaller than a second thickness of the chip carrier in the chip supporting region.

17 Claims, 15 Drawing Sheets

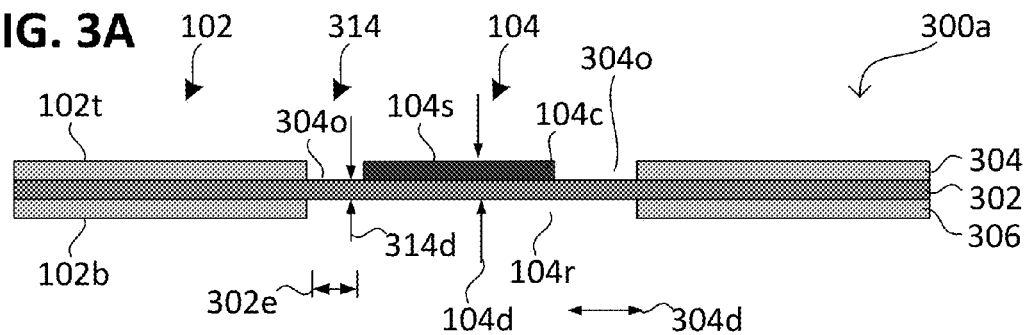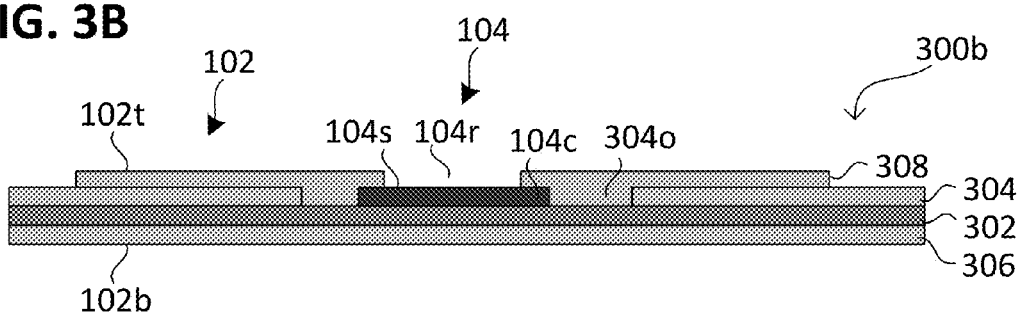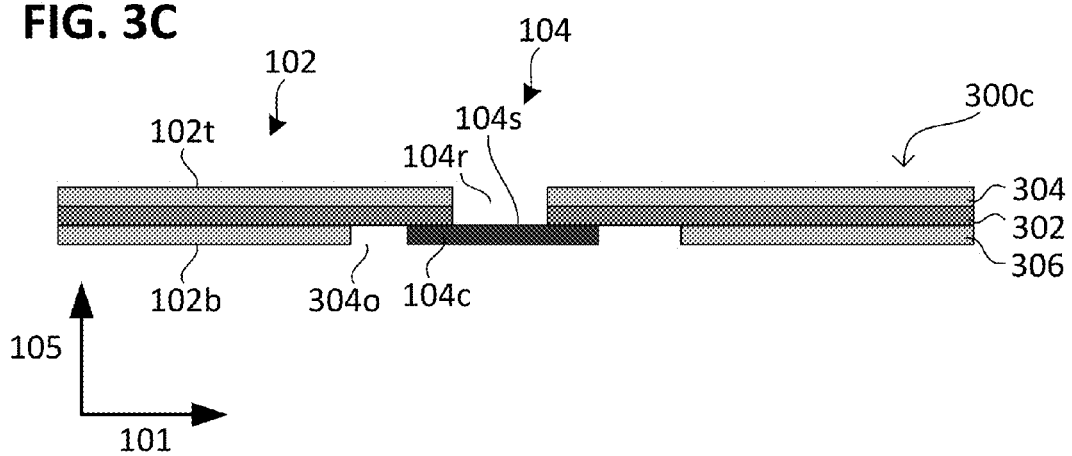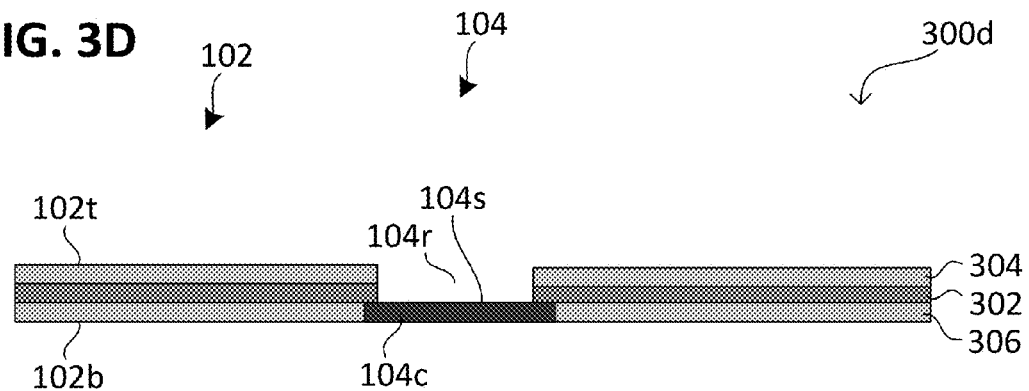

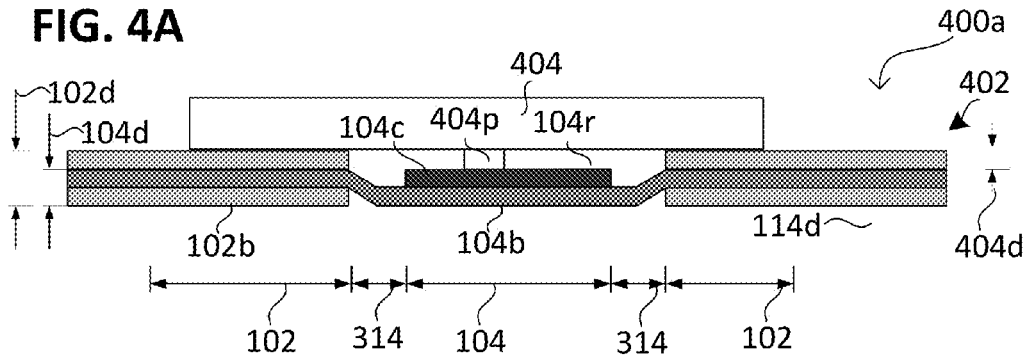
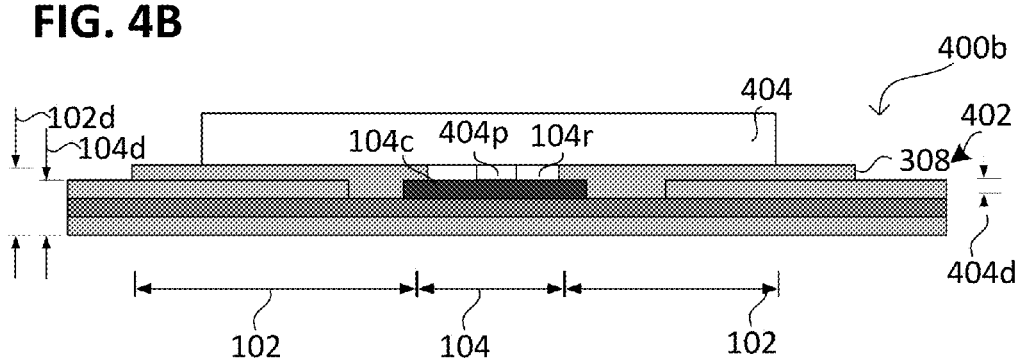
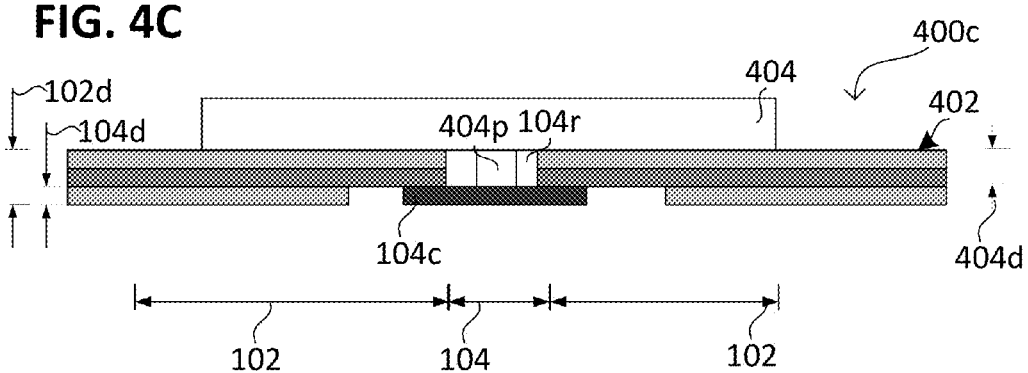
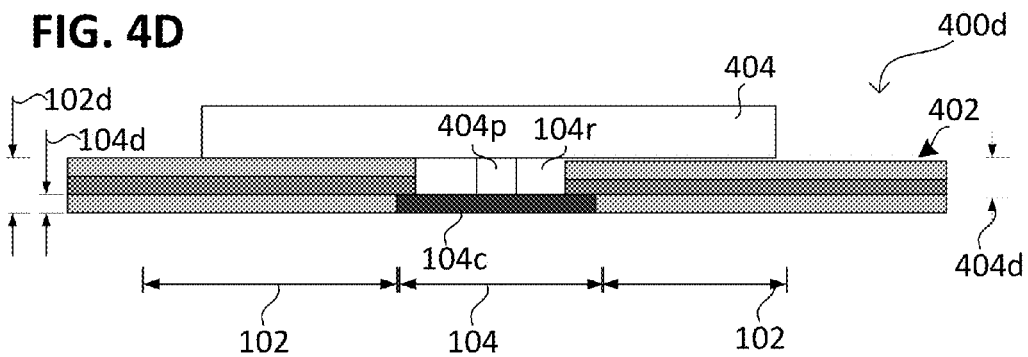

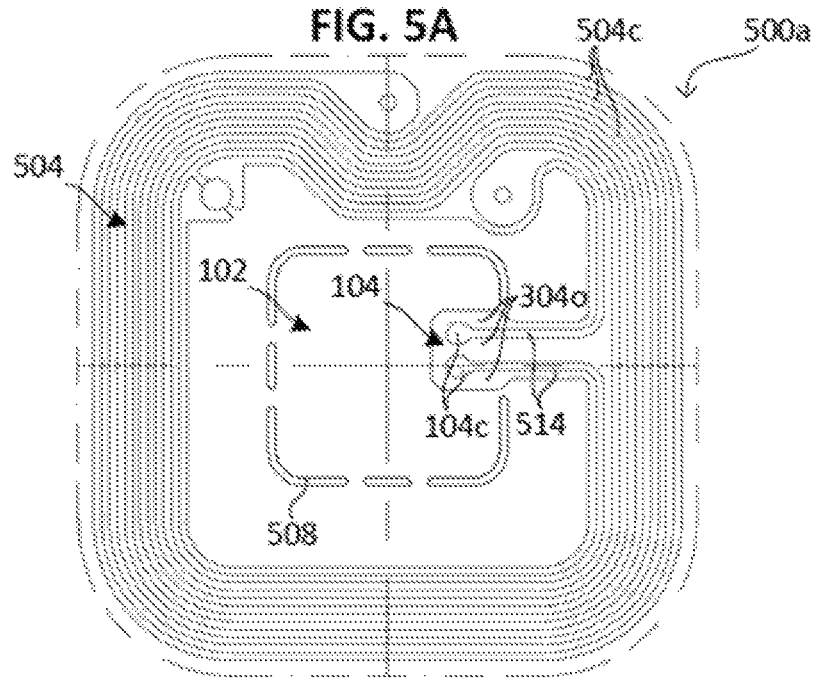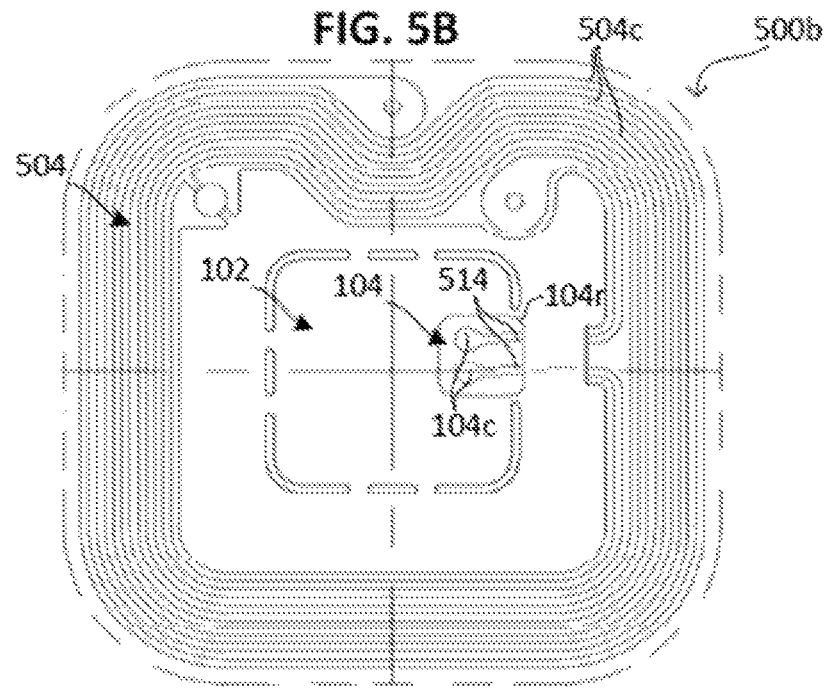

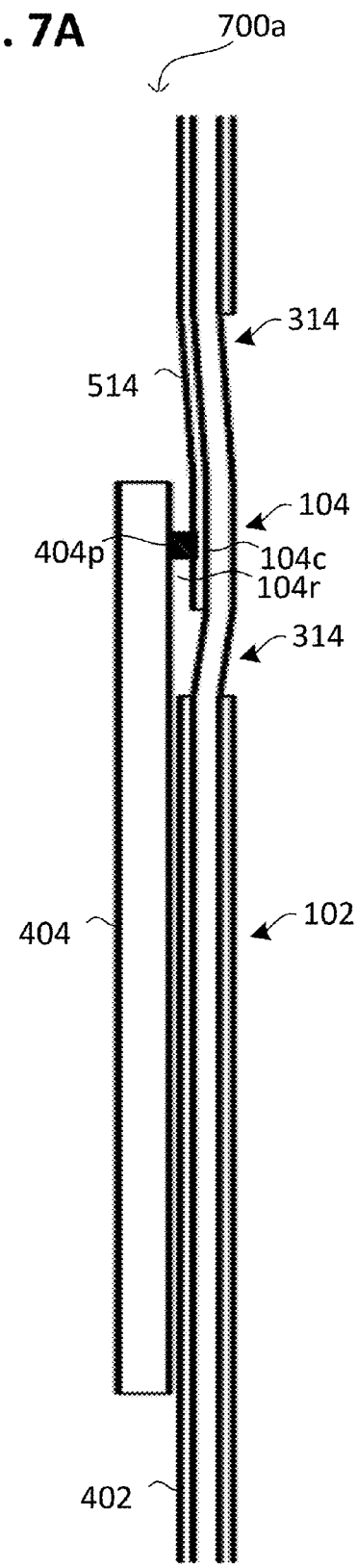
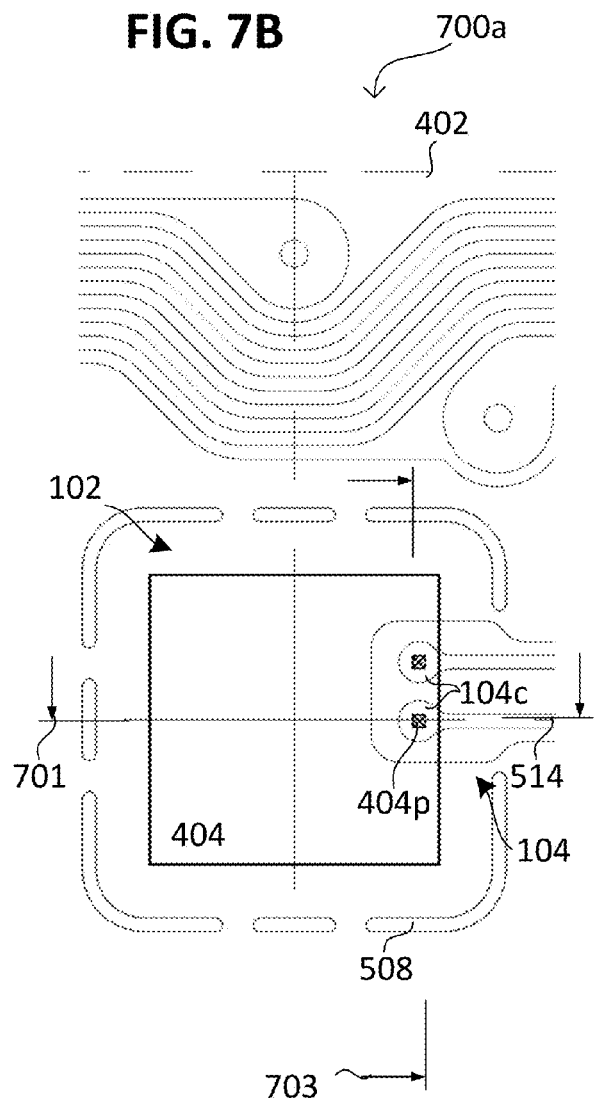
FIG. 7A
FIG. 7B

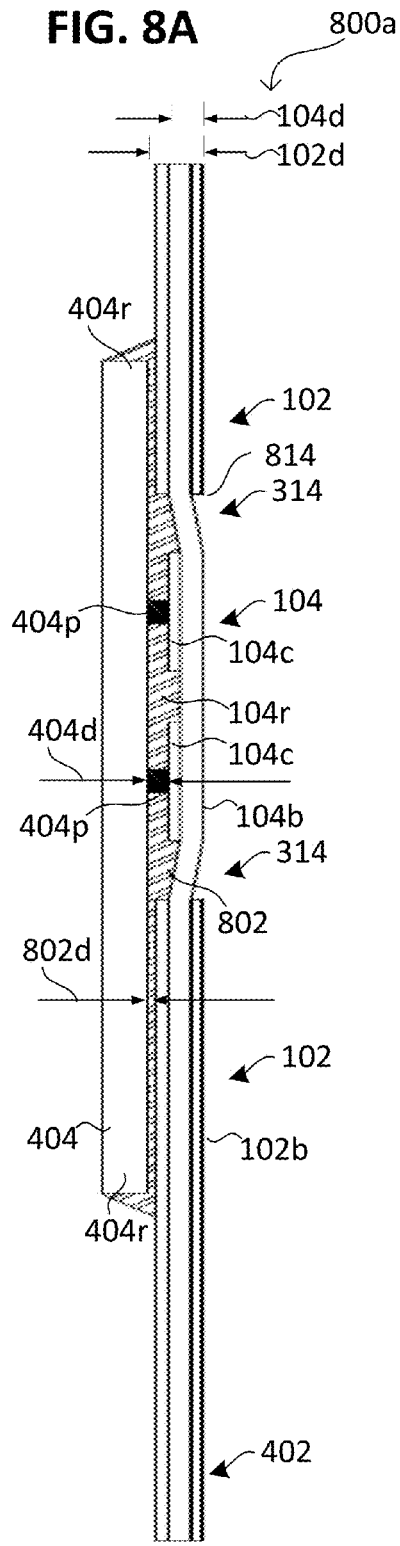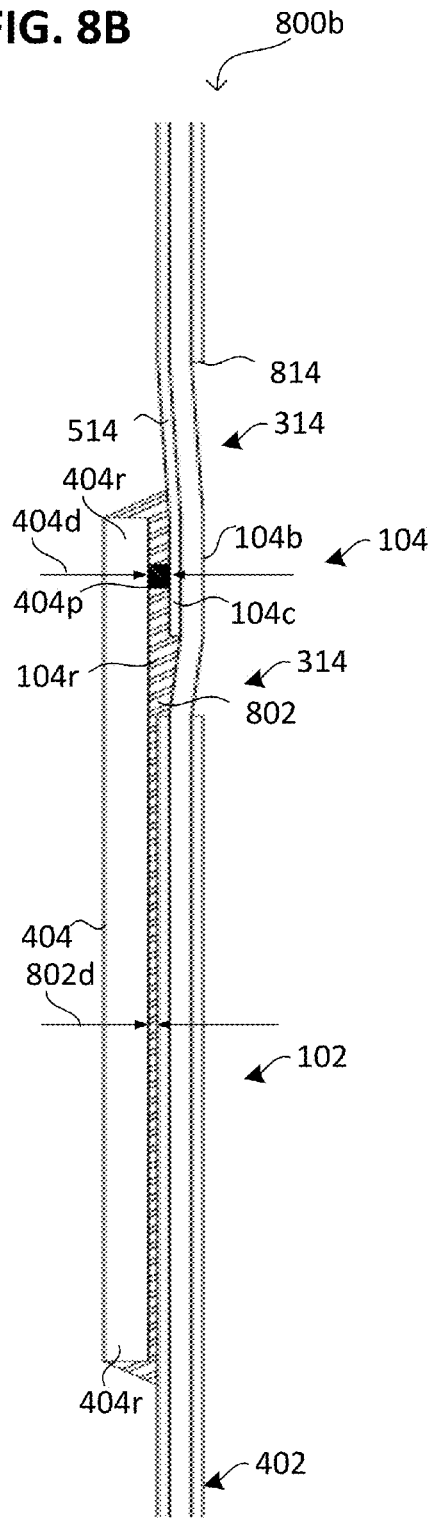

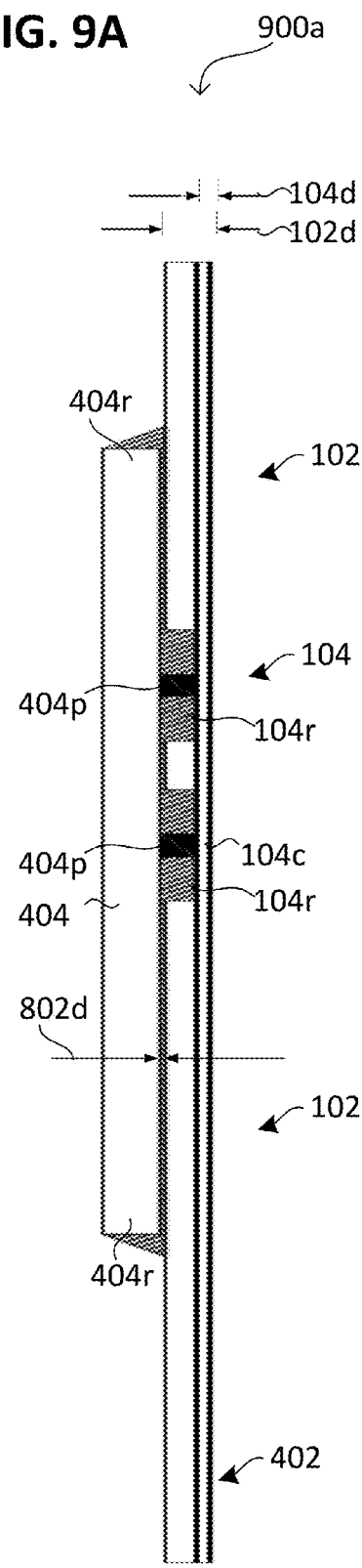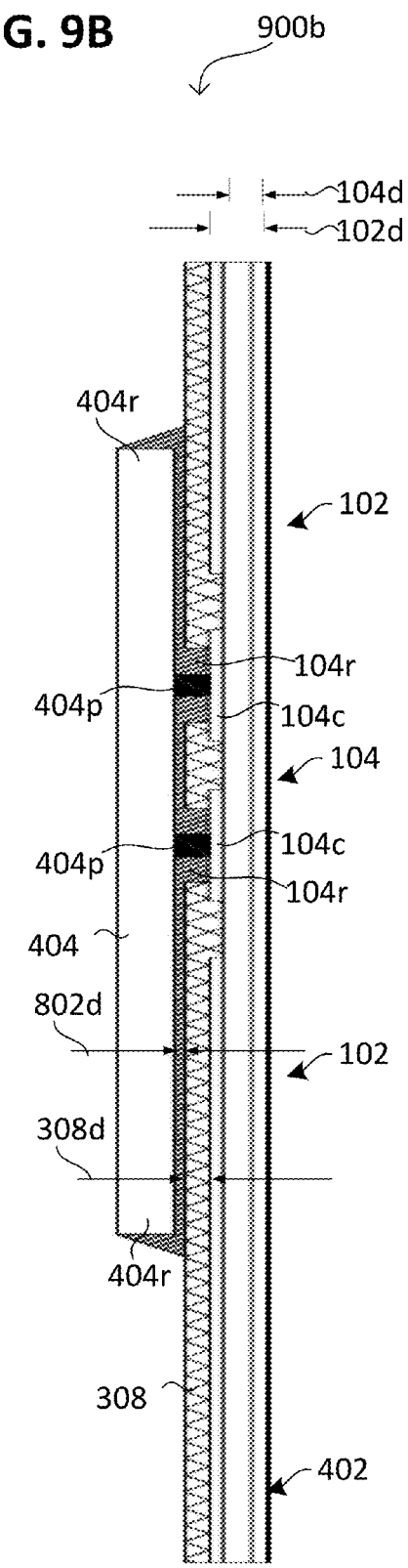

PRIOR ART

CHIP CARRIER, A DEVICE AND A METHOD

CROSS-REFERENCE TO RELATED APPLICATION

This application claims priority to German Patent Application Serial No. 10 2015 114 645.2, which was filed Sep. 2, 2015, and is incorporated herein by reference in its entirety.

TECHNICAL FIELD

Various embodiments relate generally to a chip carrier, a device and a method.

BACKGROUND

In general, a semiconductor chip (also called integrated circuit, IC, chip, or microchip) may be processed in semiconductor technology on and/or in a wafer (or a substrate or a carrier), singulated and embedded. A readily processed chip (e.g. an embedded integrated circuit) may be assembled in or on a substrate electrically contacting each other to form a device with a certain functionality, e.g. a smart card or other chip cards.

For the assembly of the chip 1502 (see FIG. 15A and FIG. 15B), a glue material 1504 is applied on the substrate 1506. Then, the chip 1502 is placed face-down into the glue 1504, in other words, the contact bumps 1512 of the chip 1502 facing the contact areas 1516 of the substrate 1506. During assembly of the chip 1502, external mechanical load and heat is applied to the chip 1502 in order to bring the contact bumps 1512 in physical contact with the contact areas 1516 and to cure the glue 1504 to permanently affix the chip 1502 on the substrate 1506. Additional internal mechanical load may arise from the curing process of the glue 1504 (glue cure process) in which the glue 1504 loses volume resulting in a tension force between the chip 1506 and the substrate 1506.

Due to the mechanical load, the chip 1502 may deform resulting in a bending stress applied to the chip 1502, which results from a combination of a shrinkage of the glue 1504 and a bending stress of the chip caused by the pressing the chip 1502 on the substrate 1506 during the glue cure process.

When the chip 1502 is assembled on a conventional substrate 1506, the contact area 1516 with the contact bumps 1512 is supported by a thermode on the rear side of the substrate 1506 during the curing press process. This will cause a sloped orientation of the chip 1502 in the long direction (see FIG. 15B) and a mechanically bending of the chip 1502 in the cross direction (see FIG. 15A). The mechanical stress caused by the assembling procedure may impair the device, e.g. reduce the reliability of the chip, e.g. when assembled in chip cards. For example, the mechanical load may promote crack formation and crack propagation in the chip, resulting in an uncontrolled or undefined behavior, e.g. failure or malfunction, of the chip and the device.

SUMMARY

According to various embodiments, a chip carrier may include: a chip supporting region configured to support a chip; a chip contacting region including at least one contact pad for electrically contacting the chip; wherein the chip carrier is thinned in the chip contacting region such that a first thickness of the chip carrier at the at least one contact pad is smaller than a second thickness of the chip carrier in the chip supporting region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A to FIG. 3D respectively show schematically a chip carrier according to various embodiments in a cross sectional view in a method according to various embodiments;

FIG. 4A to FIG. 4D respectively show schematically a device according to various embodiments in a cross sectional view in a method according to various embodiments;

FIG. 5A and FIG. 5B respectively show schematically a chip carrier according to various embodiments in a front view or a cross sectional view;

FIG. 7A shows schematically a device according to various embodiments in a cross sectional view;

FIG. 7B shows schematically a chip carrier according to various embodiments in a front view or a cross sectional view;

FIG. 8A and FIG. 8B respectively show schematically a device according to various embodiments in a cross sectional view in a method according to various embodiments;

FIG. 9A and FIG. 9B respectively show schematically a device according to various embodiments in a cross sectional view in a method according to various embodiments;

DESCRIPTION

Figure 1A:
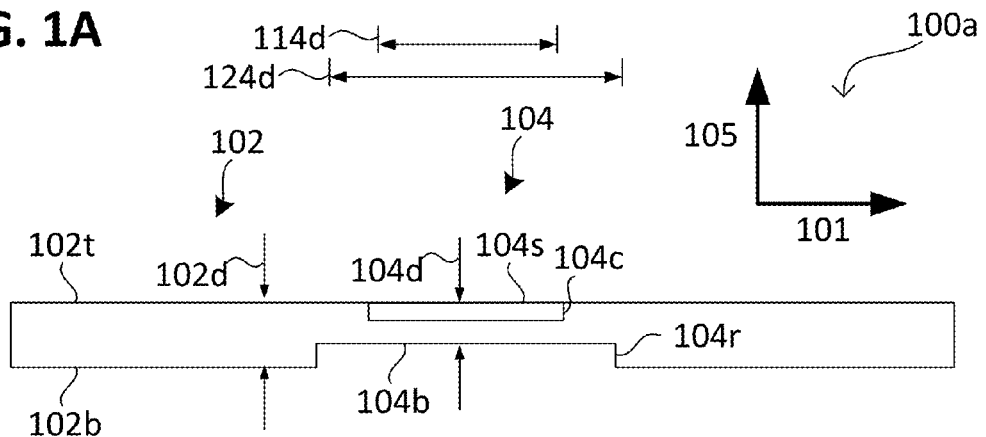
FIG. 1A to FIG. 1D respectively show schematically a chip carrier according to various embodiments in a cross sectional view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, a mechanical stress to which a chip is exposed during assembling may be reduced. Illustratively, a device (also referred to as chip device, module or semiconductor module) may be provided, the device including the assembled chip, wherein the device includes a high reliability.

According to various embodiments, a substrate (also referred to as chip carrier) may be provided for a semiconductor module. The chip may be assembled in Flip Chip technology, also referred to as "Flip Chip on Substrate" (FCOS®). In other words, the chip may be assembled with its contact area facing the chip carrier.

According to various embodiments, a semiconductor module may be provided, e.g. a FCOS module, including one or more circuit structures. Each circuit structure may be configured to provide a predetermined functionality, as among others may be a contactless communication (also referred to as contactless communication circuit), storage or displaying information. For example, a circuit structure may be configured in "Coil on Module Contactless" (COM-CL) technology. In this case, the circuit structure may include or be formed from a coil, e.g. a pancake coil (e.g. formed from a foil).

According to various embodiments, thin or very thin chips may be assembled on the chip carrier. A very thin chip may have a thickness in the range from about 30 µm to about 80 µm, a thin chip may have a thickness in the range from about 80 µm to about 200 µm. For example, a device including a contactless communication circuit may provide a Contactless Chip Card, e.g. for applications like "Public Transport", "Identification (ID)" or "Banking".

In FCOS assembly, the terminals (contact terminals) of the chip are covered by metallic contact bumps, e.g. made from a metal (e.g. gold), e.g. in stud bump technology (gold-stud bump), an electroless nickel-gold (NiAu) technology (NiAu Bump) or other appropriate technologies.

According to various embodiments, forming an opening may include or be formed from at least one of punching, etching, laser ablation.

FIG. 1A, FIG. 1B, FIG. 1C and FIG. 1D respectively show schematically chip carriers 100a to 100d according to various embodiments in a cross sectional view (e.g. viewed along a first support surface 102t) including a chip supporting region 102 configured to support a chip (not shown) and a chip contacting region 104 including at least one contact pad 104c. Each chip carrier 100a to 100d may be thinned in the chip contacting region 104 such that a first thickness 104d of each chip carrier 100a to 100d at the at least one contact pad 104c is smaller than a second thickness 102d of each chip carrier 100a to 100d in the chip supporting region 102.

According to various embodiments, the at least one contact pad 104c defines a contact surface 104s at which the chip is physically contacted, when a chip is received over each chip carrier 100a to 100d. Illustratively, the contact surface 104s may be a front surface of the chip contacting region 104 on a first side (illustratively, a front side) of each chip carrier 100a to 100d, e.g. a front surface of the at least one contact pad 104c.

According to various embodiments, the chip supporting region 102 defines a first support surface 102t for supporting the chip and a second support surface 102b for supporting the chip supporting region 104 when the chip is received, e.g. pressed against each chip carrier 100a to 100d. Illustratively, the first support surface 102t may be a front surface of the chip supporting region 102 on a first side (illustratively, a front side) of each chip carrier 100a to 100d. Illustratively, the second support surface 102b may be a back surface of the chip supporting region 102 on a second side (illustratively, a back side) of each chip carrier 100a to 100d.

According to various embodiments, the chip contacting region 104 defines a third support surface 104b for supporting the chip contacting region 104 when the chip is received, e.g. pressed against each chip carrier 100a to 100d. Illustratively, the third support surface 104b may be a back surface of the chip contacting region 104 on a second side (illustratively, a back side) of each chip carrier 100a to 100d.

According to various embodiments, at least one of the first support surface 102t, the second support surface 102b, the third support surface 104b, the contact surface 104s may be planar. The first support surface 102t and the contact surface 104s may be disposed on the first side of each chip carrier 100a to 100d and the second support surface 102b and the third support surface 104b may be disposed on the second side of each chip carrier 100a to 100d opposite the first side. The first support surface 102t and the contact surface 104s may face the chip when the chip is received over the chip supporting region 102. The second support surface 102b and the third support surface 104b may face a supporting element during assembling the chip.

According to various embodiments, the second support surface 102b may be substantially parallel (in other words, having a maximum tilting of less than about 10°, e.g. less than about 5°, e.g. less than about 1°, e.g. parallel) to at least one of the contact surface 104s, the third support surface 104b, the first support surface 102t (e.g. at least pairwise). In other words, the second support surface 102b may be substantially parallel to the contact surface 104s, the third support surface 104b and/or the first support surface 102t.

Figure 1B:
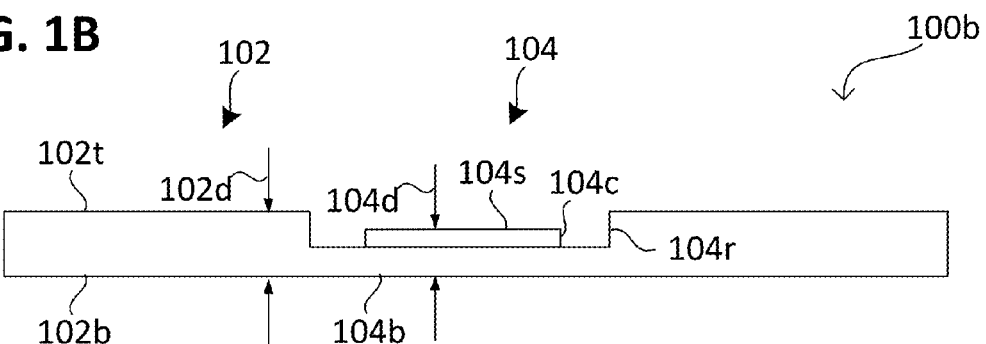
Figure 1C:
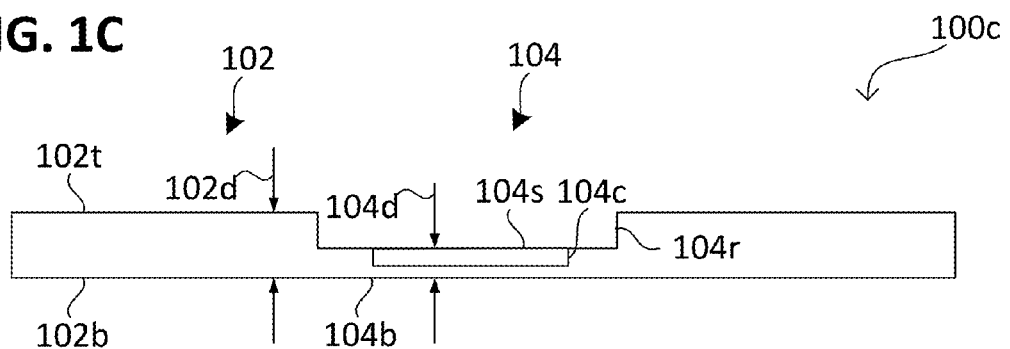
Figure 1D:
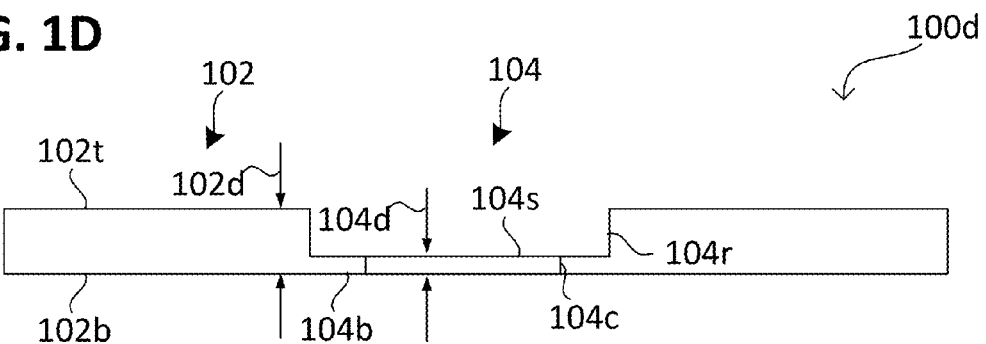

According to various embodiments, at least one of the contact surface 104s and the third support surface 104b is disposed between the first support surface 102t and the second support surface 102b. For example, the third support surface 104b may be disposed between the first support surface 102t and the second support surface 102b, as illustrated in FIG. 1A (in other words, the third support surface 104b may be recessed in the chip carrier 100a). In that case, the chip carrier 100a may include a recessed third support surface 104b. Alternatively or additionally, the contact surface 104s may be disposed between the first support surface 102t and the second support surface 102b, as illustrated in FIG. 1B, FIG. 1C and FIG. 1D (in other words, the contact surface 104s may be recessed in each chip carrier 100a to 100d). In that case, each chip carrier 100a to 100d may include a recessed contact surface 104s.

According to various embodiments, a distance between the contact surface 104s and the third support surface 104b may be smaller than a distance between the first support surface 102t and the second support surface 102b. The distance between the contact surface 104s and the third support surface 104b may define the first thickness 104d. The distance between the first support surface 102t and the second support surface 102b may define the second thickness 102d.

The first thickness 104d may be smaller than about 90% of the second thickness 102d, e.g. smaller than about 80% of the second thickness 102d, e.g. smaller than about 70% of the second thickness 102d, e.g. smaller than about 60% of the second thickness 102d, e.g. smaller than about 50% of the second thickness 102d, e.g. smaller than about 40% of the second thickness 102d, e.g. in the range from about 30% of the second thickness 102d to about 80% of the second thickness 102d.

According to various embodiments, at least one pair the contact surface 104s and the first support surface 102t; or the second support surface 102b and the third support surface 104b may be coplanar (pairwise). For example, the contact surface 104s and the first support surface 102t may be coplanar, as illustrated in FIG. 1A. Alternatively or additionally, the second support surface 102b and the third support surface 104b may be coplanar, as illustrated in FIG. 1B, FIG. 1C and FIG. 1D.

According to various embodiments, each chip carrier 100a to 100b may include a recess 104r in the chip contacting region 104 overlapping the at least one contact pad 104c. In other words, into a lateral direction a perimeter of the recess 104r may extends further than a perimeter of the at least one contact pad 104c. For example, a lateral extension 114d of the at least one contact pad 104c may be smaller than a lateral extension 124d of the recess 104.

According to various embodiments, the at least one contact pad 104c may be disposed opposite the recess 104r, as illustrated in FIG. 1A. In other words, the at least one contact pad 104c may be disposed on the first side and the recess 104r may be disposed on the second side.

Alternatively, the at least one contact pad 104c may be disposed on the same side like the recess 104r, as illustrated in FIG. 1B, FIG. 1C and FIG. 1D. In other words, the at least one contact pad 104c may be disposed on the first side and the recess 104r may be disposed on the first side.

The at least one contact pad 104c may be disposed distant to the third support surface 104b as illustrated in FIG. 1A, FIG. 1B and FIG. 1C.

Alternatively, the at least one contact pad 104c may include at least a portion of the third support surface 104b, as illustrated in FIG. 1D. In other words, the at least one contact pad 104c may be exposed on the second side.

According to various embodiments, the at least one contact pad 104c may be disposed in the recess, as illustrated in FIG. 1B. Alternatively or additionally, the at least one contact pad 104c may be at least partially exposed by the recess 104r. In other words, at least a portion of the at least one contact pad 104c may be exposed by the recess 104r.

The chip carrier 100a is configured to receive a chip on the first side. For example, the chip carrier 100a may be configured to receive a chip (not shown) on a side of the chip carrier 100a opposite the recess 104r, e.g. if the at least one contact pad 104c is disposed opposite the recess 104r. Alternatively, the chip carrier 100b to 100c may be configured to receive a chip on a side of the chip carrier 100b to 100c on which the recess 104r is formed, e.g. if the at least one contact pad 104c is disposed in or at least partially exposed by the recess 104r.

According to various embodiments, each chip carrier 100a to 100c may include or be formed from, e.g. at least in one of the chip supporting region 102 or the chip contacting region 104 (in other words, e.g. at least in one of the chip supporting region 102 and the chip contacting region 104), a laminate including more than one layer. The laminate may include at least one foil, at least one of: a base layer foil, a metallization foil. For example, the laminate may be a foil.

Alternatively, the chip carrier 100b to 100c may include or be formed from, e.g. at least in one of the chip supporting region 102 or the chip contacting region 104, a lead frame. The lead frame may include or be formed from a metal or of an alloy. The metal or the alloy respectively may in principle include every suitable metal, e.g. at least one of nickel or copper. According to various embodiments, the alloy may include or be formed from a copper based alloy or a nickel based alloy. The alloy may include further alloying elements, e.g. at least one of tin or zinc.

Figure 2A:
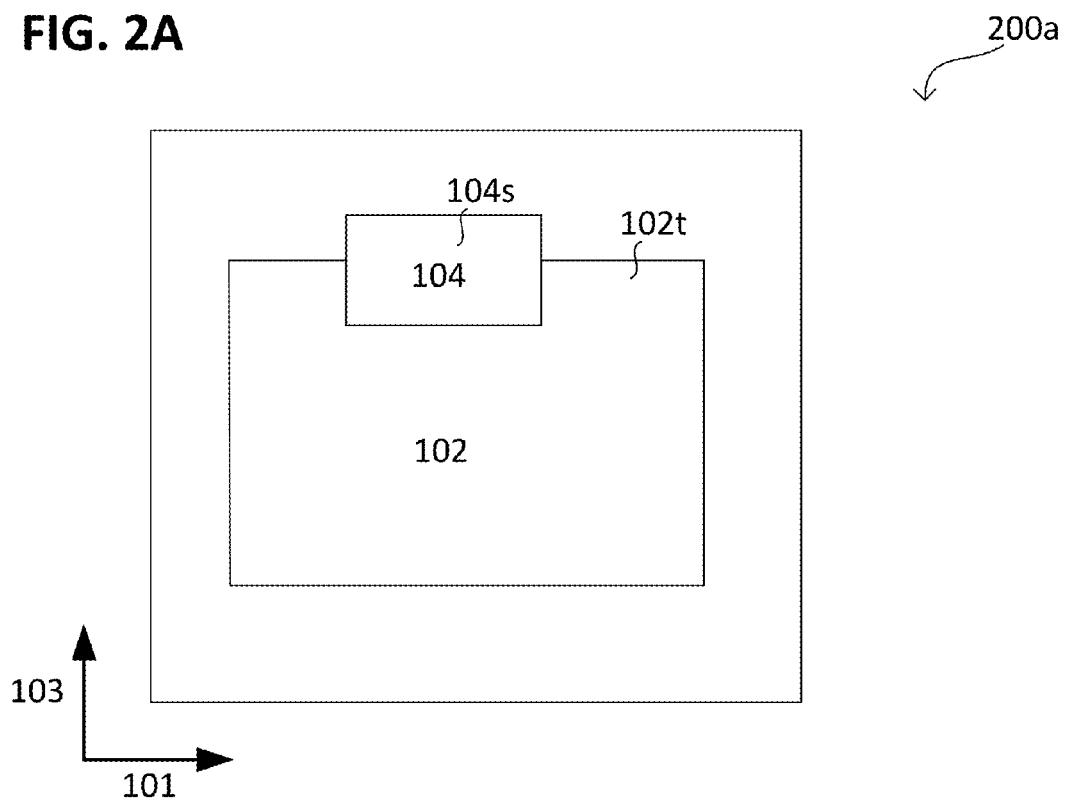
FIG. 2A and FIG. 2B respectively show schematically a chip carrier according to various embodiments in front view or a cross sectional view.

FIG. 2A illustrates schematically a chip carrier 200a according to various embodiments in front view or a cross sectional view (e.g. having a view direction perpendicular to the first support surface 102t), for example, one of the chip carriers 100a to 100d or another chip carrier described in the following. According to various embodiments, the chip contacting region 104 may be partially surrounded by the chip supporting region 102. For example, in at least one direction the chip contacting region 104 may extend further than the chip supporting region 102.

Figure 2B:
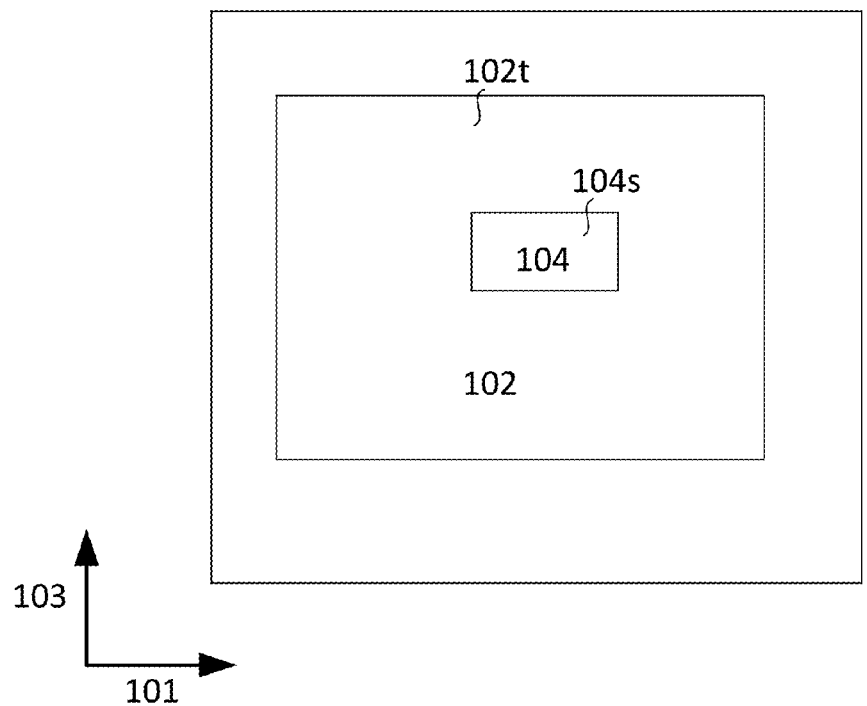

FIG. 2B illustrates schematically a chip carrier 200b according to various embodiments in front view or a cross sectional view (similar to FIG. 2A), for example, one of the chip carriers 100a to 100d or another chip carrier described in the following. According to various embodiments, the chip contacting region 104 may be surrounded (completely) by the chip supporting region 102.

FIG. 3A, FIG. 3B, FIG. 3C and FIG. 3D respectively illustrate schematically a chip carrier 300a to 300d according to various embodiments in a cross sectional view (similar to FIG. 1A) in a method according to various embodiments, for example, configured similar to one of the previously shown chip carriers 100a to 100d.

Each chip carrier 300a to 300d may include or be formed from a laminate including at least one of: an electrically insulating base layer 302, a first metallization 304 over the base layer 302, in other words, on a first side of each chip carrier 300a to 300d, a second metallization 306 over the base layer 302, in other words, on a second side of each chip carrier 300a to 300d. In other words, the electrically insulating base layer 302 may be disposed between the first metallization 304 and the second metallization 306.

For example, each chip carrier 300a to 300d may include or be formed from, e.g. at least in one of the chip supporting region 102 or the chip contacting region 104, the electrically insulating base layer 302 and the first metallization 304. In other words, in at least the chip contacting region 104, the second metallization 306 may be opened or at least partially removed, as illustrated in FIG. 3A and FIG. 3C. For example, the second side of the chip contacting region 104 may be free of a metal, as illustrated in FIG. 3A.

Alternatively, each chip carrier 300a to 300d may include or be formed, e.g. at least in one of the chip supporting region 102 or the chip contacting region 104, the electrically insulating base layer 302 and the second metallization 306. In other words, in at least the chip contacting region 104, the first metallization 304 may be opened or at least partially removed, as illustrated in FIG. 3A and FIG. 3B.

According to various embodiments, the first metallization 304 may be structured to form the at least one contact pad 104c, as illustrated in FIG. 3A and FIG. 3B. In other words, the first metallization 304 may include the at least one contact pad 104c. For example, the chip carrier 300a and 300b may include an opening 304o (also referred to as trench 304o) at least partially surrounding the at least one contact pad 104c. The opening 304o may extend at least through the first metallization 304. The opening 304o may be disposed on the first side. In other words, the first metallization 304 may include at least one first portion (e.g. in the chip contacting region 104) including or formed from the at least one contact pad 104c and at least one second portion (e.g. in the chip supporting region 102) separated from the first portion by the opening 304o. The second portion of the first metallization 304 may at least partially surround the at least one contact pad 104c. The second portion of the first metallization 304 may include the first support surface 102t. The opening 304o may expose the electrically insulating base layer 302 at least partially (in other words, the opening 304o may exposed at least a portion of the electrically insulating base layer 302), e.g. on the first side.

According to various embodiments, the second metallization 306 may be structured to form the recess 104r opposite the at least one contact pad 104c, as illustrated in FIG. 3A. In other words, the second metallization 306 may be opened in the chip contacting region 104 to provide the recess 104r in the chip carrier 300a. The recess 104r may expose the electrically insulating base layer 302 at least partially, e.g. on the second side. The recess 104r may overlap the opening 304o such that at least one portion 302e of the electrically insulating base layer 302 may be exposed on both sides, the first side and the second side, as illustrated in FIG. 3A. Alternatively or additionally, at least one portion 302e of the electrically insulating base layer 302 (e.g. the at least one portion 302e surrounding the at least one contact pad 104c partially) may be free of a metal.

The at least one portion 302e of the electrically insulating base layer 302 may be disposed in a connection region 314 of the chip carrier 300a ((illustratively, a further thinned region). The chip carrier 300a may include a third thickness 314d in the connection region 314 smaller than the first thickness 104d of the chip carrier 100a in the chip contacting region 104 (e.g. due to the exposed electrically insulating base layer 302), e.g. at the at least one contact pad 104c. In other words, the chip carrier 300a may include a third thickness 314d in the connection region 314 smaller than the second thickness 104d of the chip carrier 100a in the chip supporting region 102.

The connecting region 314 may surround the chip contacting region 104. The connecting region 314 may be disposed between the chip contacting region 104 and the chip supporting region 102 (e.g. surrounded by the chip supporting region 102).

The third thickness 314d (the further thinned region) may provide a reduced stress/strain ratio of the chip carrier 300a in the connection region 314. In other words, a stress/strain ratio of the chip carrier 100a in the chip contacting region 104 (first stress/strain ratio), e.g. at the at least one contact pad 104c, may be greater than a stress/strain ratio of the chip carrier 300a in the connection region 314 (third stress/strain ratio). Further, a stress/strain ratio of the chip carrier 100a in the chip supporting region 102 (second stress/strain ratio) may be greater than the stress/strain ratio of the chip carrier 300a in the connection region 314. Optionally, the second stress/strain ratio may be greater than the first stress/strain ratio.

The stress/strain ratio may be understood as stress needed to achieve a certain strain. Illustratively, the lower the stress/strain ratio is, the easier a material or region is deformable. The stress/strain ratio may define at least one of the following parameters of the material or the region: the ultimate strength; the yield strength (also referred to as yield point), the young's modulus, the stiffness. The greater the stress/strain ratio is the greater at least one of the following parameters may be: the ultimate strength; the yield strength, the young's, stiffness modulus.

The stiffness may be understood as resist of a material or a region against deformation. For example, a reduced stiffness of the chip carrier 300a in the connection region 314 may be provided. In other words, a stiffness of the chip carrier 100a in the chip contacting region 104 (first stiffness), e.g. at the at least one contact pad 104c, may be greater than a stiffness of the chip carrier 300a in the connection region 314 (third stiffness). Further, a stiffness of the chip carrier 100a in the chip supporting region 102 (second stiffness) may be greater than the stiffness of the chip carrier 300a in the connection region 314. Optionally, the second stiffness may be greater than the first stiffness.

The depth of the recess 104r may be defined by the thickness of the second metallization 306, e.g. the depth of the recess 104r may be substantially equal to the thickness of the second metallization 306.

An extension 304d of the connecting region 314 (e.g. an extension of the opening 304o) into a direction away from the at least one contact pad 104c (e.g. parallel to the first support surface 102t) may be adjusted according the third thickness 314d. According to various embodiments, the extension 304d may be greater than about 400% of the third thickness 314d, e.g. greater than about 500% of the third thickness 314d, greater than about 600% of the third thickness 314d, greater than about 700% of the third thickness 314d, greater than about 800% of the third thickness 314d, e.g. greater than about 900% of the third thickness 314d, e.g. greater than about 1000% of the third thickness 314d, e.g. in the range from about 400% to about 1500% of the third thickness 314d. For example, the extension 304d may be greater than about 100 μm, e.g. greater than about 120 μm, e.g. greater than about 140 μm, e.g. greater than about 160 μm, e.g. greater than about 180 μm, e.g. greater than about 200 μm, e.g. greater than about 250 μm, e.g. greater than about 300 μm, e.g. in the range from about 150 μm to about 500 μm. The third thickness 314d may be in the range from about 10 μm to about 50 μm, e.g. in the range from about 20 μm to about 40 μm, e.g. about 25 μm.

An extension of the at least one contact pad 104c (e.g. each contact pad of the at least one contact pad 104c), e.g. parallel to the first support surface 102t, may be in the range from about 200 μm to about 400 μm, e.g. about 300 μm.

Alternatively, to the shown chip carrier 300a, the recess 104r may be provided by a spacer layer 308 as illustrated in FIG. 3B. In other words, the chip carrier 300b may include a spacer layer 308. The spacer layer 308 may be disposed over the first metallization 304, e.g. at least partially in the chip supporting region 102. In other words, the spacer layer 308 may cover the first metallization 304 in the chip supporting region 102 at least partially.

Optionally, the spacer layer 308 may extend into the chip contacting region 104. For example, the spacer layer 308 may at least partially cover the opening 304o, for example, being in physical contact with the electrically insulating base layer 302 in the opening 304o. Alternatively, the opening 304o may extend through the spacer layer 308 and the first metallization 304.

Optionally, the spacer layer 308 may extend at least partially over the at least one contact pad 104c. In other words, the at least one contact pad 104c may be partially covered by the spacer layer 308. The spacer layer 308 may include an opening extending through the spacer layer 308 to provide the recess 104r. The recess 104r may at least partially expose the at least one contact pad 104c. In other words, the recess 104r may expose at least a portion of the at least one contact pad 104c. Alternatively, the recess 104r may expose the at least one contact pad 104c (completely), e.g. when the opening 304o may extend through the spacer layer 308 and the first metallization 304.

When the spacer layer 308 is used, the spacer layer 308 may include the first support surface 102t. In other words, the chip received over the chip carrier 300b may be supported by the spacer layer 308. Illustratively, the spacer layer 308 defines a distance between the chip and the at least one contact pad 104c (e.g. its contact surface 104s).

According to various embodiments, the spacer layer 308 is formed conformal over at least one of the chip contacting region 104 and the chip supporting region 102. In other words, a surface profile of the spacer layer 308 may be similar to a surface profile of the chip carrier 300b (e.g. in at least one of the chip contacting region 104 and the chip supporting region 102), e.g. of at least one of: the first metallization 304, the opening 304o, the electrically insulating base layer 302.

Alternatively, the spacer layer 308 may be formed non-conformal over at least one of the chip contacting region 104 and the chip supporting region 102. In other words, a surface profile of the spacer layer 308 may be different to a surface profile of the chip carrier 300b (e.g. in at least one of the chip contacting region 104 and the chip supporting region 102), e.g. of at least one of the first metallization 304, the opening or the electrically insulating base layer 302. For example, the spacer layer 308 may include a planar surface profile (e.g. over the opening 304o), e.g. including or formed from the first support surface 102t.

According to various embodiments, the spacer layer 308 may have a thickness in the range from about 10 μm to about 50 μm, e.g. in the range from about 20 μm to about 40 μm (e.g. at least over the chip supporting region 102).

The spacer layer 308 may include or be formed from a broad variety of materials, e.g. including an electrically insulating material. This may provide to electrically isolate the chip from the first metallization 304.

For example, the spacer layer 308 may include or be formed from a solder stop material, e.g. a non-metallic material or a solder resist. For example, the spacer layer 308 may include or be formed from a polymer solder stop, e.g. the solder resist, e.g. a resin (e.g. like an epoxy resin). Alternatively, the solder stop material may include or be formed from an oxide, e.g. an oxide stop material, e.g. a metal oxide.

Alternatively, the spacer layer 308 may include or be formed from an adhesive, e.g. a polymer adhesive, e.g. an epoxy adhesive.

Optionally, the spacer layer 308 may include or be formed from spacer particles (e.g. electrically insulating spacer particles), e.g. having an extension, e.g. a diameter, in the range from about 10 μm to about 50 μm, e.g. in the range from about 20 μm to about 40 μm. The spacer particles may include or be formed from a polymer.

The depth of the recess 104r may be defined from the thickness of the spacer layer 308 (e.g. in the chip supporting region 102), e.g. the depth of the recess 104r may be substantially equal to the thickness of the spacer layer 308 (e.g. in the chip supporting region 102).

Alternatively to each chip carrier 300a and 300b, the second metallization 306 may include the at least one contact pad 104c, as illustrated in FIG. 3C and FIG. 3D. For example, the second metallization 306 may be structured to form the at least one contact pad 104c, as illustrated in FIG. 3C. In other words, the second metallization 306 may include the at least one contact pad 104c. For example, the chip carrier 300c may include an opening 304o (also referred to as trench 304o) at least partially surrounding the at least one contact pad 104c. The opening 304o may extend at least through the second metallization 306. The opening 304o may be disposed on the second side. In other words, the second metallization 306 may include at least one first portion (e.g. in the chip contacting region 104) including or formed from the at least one contact pad 104c and at least one second portion (e.g. in the chip supporting region 102) separated from the first portion by the opening 304o. The second portion of the second metallization 306 may at least partially surround the at least one contact pad 104c. The second portion of the second metallization 306 may include the second support surface 102b. The opening 304o may expose the electrically insulating base layer 302 at least partially, e.g. on the second side.

Optionally, the at least one contact pad 104c may be connected (e.g. by at least one electrical line) to the second portion of at least one of the first metallization 304 or the second metallization 306. For example, the at least one contact pad 104c may be connected to the second portion of the second metallization 306, e.g. in at least one direction, as exemplarily illustrated in FIG. 3D. Alternatively or additionally (not shown), the at least one contact pad 104c may be connected to the second portion of the first metallization 304 (e.g. in at least one direction), e.g. in at least one of the chip carrier 300a, the chip carrier 300b.

As illustrated in FIG. 3C and FIG. 3D the recess may be provided by the electrically insulating base layer 302 and the first metallization 304 (illustratively, by an opening extending through the electrically insulating base layer 302 and the first metallization 304). In other words, the chip carrier 300c and 300d may include an opening extending through the electrically insulating base layer 302 and the first metallization 304 to form the recess 104r. The bottom of the recess may be provided by the at least one contact pad 104c, for example, by the contact surface 104s. In other words, the recess 104r may expose the contact surface 104s.

The depth of the recess 104r may be defined from the thickness of the second metallization 306 and the electrically insulating base layer 302 (e.g. in the chip supporting region 102), e.g. the depth of the recess 104r may be substantially equal to the sum of the thickness second metallization 306 and the thickness of the electrically insulating base layer 302 (e.g. in the chip supporting region 102).

According to various embodiments, the electrically insulating base layer 302 may have a thickness in the range from about 10 μm to about 50 μm, e.g. in the range from about 20 μm to about 30 μm, e.g. about 25 μm.

According to various embodiments, at least one of the first metallization 304 or the second metallization 306 may have a thickness in the range from about 5 μm to about 30 μm, e.g. in the range from about 10 μm to about 20 μm, e.g. about 15 μm.

According to various embodiments, the electrically insulating base layer 302 may include or be formed from a polymer (e.g. polyimide), e.g. in form of a foil (polymer foil). For example, the electrically insulating base layer 302 may include or be formed from an elastomer or a thermoplastic.

According to various embodiments, at least one of the first metallization 304 or the second metallization 306 may include or be formed from a metal, e.g. copper, nickel, etc., e.g. a metal foil. Alternatively or additionally, at least one of the first metallization 304 or the second metallization 306 may include or be formed from an at least partially electrodeposited metal layer. For example, forming at least one of the first metallization 304 or the second metallization 306 may include forming a seed layer (e.g. over the base layer, e.g. on at least one of the first side or the second side) and electrodepositing (electroplating) one or more metal layers (one or more electrodeposited metal layers) over the at least one seed layer.

Alternatively or additionally to the recess 104r on the second side of the chip carrier 300a, a recess 104r may be formed on the first side, e.g. in a spacer layer 308. In other words, the chip carrier 300a may include the recess 104r and may optionally include the spacer layer 308 and a further recess 104r formed in the spacer layer 308, similar to the chip carrier 300b. In this case, the connecting region 314 may be free (uncovered) from the spacer layer 308. This may enable to adapt the chip carrier 300a to a greater protrusion height.

Alternatively or additionally to the recess 104r on the first side of the chip carrier 300b, a recess 104r may be at least one of formed or extend in the electrically insulating base layer 302, similar to chip carriers 300c or 300d. For example, the recess 104r of the chip carrier 300b may extend through the spacer layer 308 and through the electrically insulating base layer 302, similar to the chip carrier 300c. In this case, the recess 104r of the chip carrier 300b may also extend through the first metallization 304 and the at least one contact pad 104c may be provided by the second metallization 306. This may enable to adapt the chip carrier 300a to a greater protrusion height.

FIG. 4A, FIG. 4B, FIG. 4C, and FIG. 4D respectively illustrate schematically a device 400a to 400d according to various embodiments in a cross sectional view (similar to FIG. 1A) in a method according to various embodiments. Each device 400a to 400d may include a chip carrier 402 and a chip 404.

The chip carrier 402 may be configured similar to any of the chip carriers 300a to 300d. Alternatively, each chip carrier 402 may be configured similar to another chip carrier described herein, e.g. any of the chip carriers 100a to 100d, the chip carriers 500a, 500b.

The chip carrier 402 may include the chip supporting region 102 configured to support the chip 404, e.g. the chip 404 having an extension less than or equal to the chip supporting region 102. Further, the chip carrier 402 may include a chip contacting region 104 including the at least one contact pad 104c for electrically contacting the chip 104. The chip carrier 402 may be thinned in the chip contacting region 104 such that a thickness 104d (first thickness, see for example, FIGS. 1A to 1D) of the chip carrier 402 at the at least one contact pad 104c is smaller than a thickness 102d (second thickness, see for example, FIGS. 1A to 1D) of the chip carrier 402 in the chip supporting region 102.

According to various embodiments, the chip 404 may include at least one contact protrusion 404p. The at least one contact protrusion 404p may have a protrusion height 404d (extending away from the chip 404) in the range from about 10 μm to about 50 μm, e.g. in the range from about 20 μm to about 40 μm, e.g. in the range from about 25 μm to about 35 μm, e.g. about 30 μm.

According to various embodiments, the chip 404 may be received over the chip carrier 402 such that the at least one contact protrusion 404p extends at least partially into the chip contacting region 104, e.g. into the recess 104r. The at least one contact protrusion 404p may be in physical contact to the at least one contact pad 104c, e.g. its contact surface 104s (see for example, FIG. 1A to FIG. 1D). The at least one contact protrusion 404p may be in electrical contact (electrically connected) with the at least one contact pad 104c, e.g. its contact surface 104s.

According to various embodiments, a difference between the first thickness and the second thickness is smaller than the protrusion height 404d. Illustratively, the difference between the first thickness and the second thickness may define the depth of the recess 104. The depth of the recess 104r may be smaller than the protrusion height 404d. Illustratively, this may enable to contact the at least one contact protrusion 404p by the contact surface 104s.

According to various embodiments, the at least one contact protrusion 404p may include or be formed from a stud bump.

According to various embodiments, the at least one contact protrusion 404p may include or be formed from a metal, e.g. a solder material, e.g. including or formed from at least one of: tin (Sn), lead (Pb). For example, the solder material may be a Sn based solder alloy or a Pb based solder alloy. Optionally, the solder alloy may include alloying elements, such as Mg, Zn, Zr, Ni, Pd, or Au.

Optionally, each device 400a to 400d may include an adhesive layer (not shown, see for example, FIG. 8A or FIG. 8B) disposed between the chip 404 and the chip carrier 402. The adhesive layer may be configured to adhere the chip 404 to the chip supporting region 102.

As illustrated in FIG. 4A, the chip carrier 402 may be similar to the chip carrier 300a. The chip carrier 402 may include the connection region 314 between the chip contacting region 104 and the chip supporting region 102. The connection region 314 may be configured to elastically couple the chip contacting region with the chip supporting region, such that the at least one contact can be displaced by deforming the connection region 314 for receiving the at least one contact protrusion 404p of the chip 404.

The connection region 314 may be deformable in response to a mechanical load (e.g. a pressing force) applied to the chip contacting region 104, such that the chip contacting region 104 can be displaced for receiving a contact protrusion 404p of the chip 404. In other words, the chip contacting region 104 may by movably (e.g. resiliently) supported by the chip supporting region 102 via the connection region. In other words, the chip contacting region 104 and the chip supporting region 102 are connected by a deformable connection region 314, wherein the deformable connection region 314 at least one of elastically deforms or plastically deforms. In other words, the connection region 314 is configured to be deformed in response to a mechanical load applied to the chip contacting region 104, such that the chip contacting region 104 can be moved (displaced) by the mechanical load, e.g. without losing support to the chip supporting region via the connection region. For example, the connecting region 314 between the chip contacting region 104 and the chip supporting region 102 may be configured so that the chip contacting region 104 is resiliently supported by the chip supporting region 102 via the connecting region 314.

For example, the connection region 314 may be configured to be elastically deformed (deflected) when displacing the chip contacting region 102 (e.g. the contact surface 104s) with respect to the chip supporting region 102, e.g. if the connection region 314 includes or is formed from an elastic material (e.g. an elastomer). In other words, the connection region 314 may be configured to elastically couple the chip contacting region 102 (e.g. the contact surface 104s) with the chip supporting region 102. Alternatively or additionally, the connection region 314 may be configured to be plastically deformed when displacing the chip contacting region 102 (e.g. the contact surface 104s) with respect to the chip supporting region 102, e.g. if the connection region 314 includes or is formed from a thermoplastic material.

An elastic deformation (which may also be referred as to a flexible coupling) may be understood as a deformation (e.g. by bending, stretching, or compression) which is able to return to the original configuration (e.g. a shape or position) by itself after deformation, or deflection (e.g. displacement or distortion), in other words, in other words after releasing. A plastic deformation may be understood as a deformation which maintains after deformation, in other words after releasing. According to various embodiments, the connection region 314 may be configured to include a superposition of elastic deformation and plastic deformation.

By deforming the chip carrier 402 in the connecting region 314, the recess 104r may be formed in the chip contacting region 104 on the first side, as illustrated in FIG. 4A. According to various embodiments, the chip carrier 402 is deformed in the connecting region 314 such that the recess 104r is formed in the chip contacting region 104 on the first side, as illustrated in FIG. 4A. For example, the chip carrier 402 may be deformed in the connection region 314. For example, the chip carrier 300a may include the recess 104r on the second side. When displacing the chip contacting region 104, the chip contacting region 104 may be moved into the recess 104r on the second side such that a recess 104r on the first side, as illustrated in FIG. 4A. In this case, the third support surface 104b may be coplanar with the second support surface 102b, when the chip 404 is received over the chip carrier 402. In other words, the at least one contact protrusion 404p may extend into the recess 104r on the first side provided by the deformation of the chip carrier 402 in the connecting region 314, wherein the at least one contact protrusion 404p may contact the at least one contact pad 104c. For example, the electrically insulating base layer 302 may be corrugated when the chip carrier 402 is deformed in the connecting region 314.

According to various embodiments, the at least one contact protrusion 404p of the chip 404 may extend at least partially into the recess 104r on the first side such that the chip 404 is aligned substantially parallel to the chip supporting region 102, e.g. to its first support surface 102t.

The electrically insulating base layer 302 may be completely exposed in at least the connecting region 314. As described before, a third thickness 314d of the chip carrier 402 in the connection region 314 may be smaller than at least one of: the first thickness 104d or the second thickness 102t.

As illustrated in FIG. 4B, the chip carrier 402 may be similar to the chip carrier 300b. In this case, the at least one contact protrusion 404p may extend into the recess 104r provided by the opening in the spacer layer 308 and contact the at least one contact pad 104c.

As illustrated in FIG. 4C the chip carrier 402 may be similar to the chip carrier 300c, and as illustrated in FIG. 4D the chip carrier 402 may be similar to the chip carrier 300d. In this case, the at least one contact protrusion 404p may extend into the recess 104r provided by the opening in the electrically insulating base layer 302 and the first metallization 304, wherein the at least one contact protrusion 404p may contact the at least one contact pad 104c.

FIG. 5A illustrates schematically a chip carrier 500a according to various embodiments in a front view or a cross sectional view (similar to FIG. 2A). The chip carrier 500b may be configured similar to at least one of the chip carrier 100a, the chip carrier 300a.

As illustrated in FIG. 5A, the at least one contact pad 104c may include two contact pads 104c. In alternative embodiments the at least one contact pad 104c may also include more than two contact pads 104c, for example, three, four, five, six, seven, eight nine, ten, more than ten (etc.) contact pads 104c.

Optionally, the chip carrier 500a many include a circuit region 504. The circuit region 504 may at least partially surround the chip supporting region 102 and the chip contacting region 104.

The opening 304o of the first metallization 304 may partially surround the at least one contact pad 104c. In the case, the at least one contact pad 104c includes two or more contact pads 104c, the opening 304o may also extend between the two or more contact pads 104c (illustratively, separating the two or more contact pads 104c from each other). The at least one contact pad 104c may be electrically connected to a circuit region 504. For example, the each contact pad of the at least one contact pad 104c may be electrically connected to the circuit region 504 each by an electrical line 514 (at least one electrical line 514).

The chip carrier 500a may include one or more (at least one) circuit structures 504c disposed in the circuit region 504, e.g. electrically connected to the at least one electrical line 514. For example, the one or more circuit structures 504c may include or be formed from a contactless communication circuit, e.g. including or formed from a coil. The contactless communication circuit may be configured to generate or modify an electrical signal in response to a communication signal (e.g. transmitted by a magnetical field). Alternatively or additionally, the contactless interface circuit 504 may be configured to generate or modify a communication signal in response to an electrical signal. The electrical signal may be transmitted between the at least one contact pad 104c and the circuit region 504 via the electrical lines 514.

For example, the first metallization 304 may be structured to form a circuit structure 504c, for example, in a third portion of the first metallization 304 (see FIG. 5A). The third portion of the first metallization 304 may at least partially surround the second portion of the first metallization 304.

Optionally, the chip carrier 500a may include a separator structure 508. The separator structure 508 may include a one or more trenches and connections extending between two trenches of the separator structure 508. For example, the one or more trenches may extending at least partially through (partially through or completely through) the chip carrier 500a. The separator structure 508 may surround the chip supporting region 102 at least partially. For example, the chip supporting region 102 may be connected to the circuit region 504 by the one or more connections of the separator structure 508. The separator structure 508 may be configured to displace the chip supporting region 102 (with respect to the circuit region 504) for absorbing a mechanical load applied to the chip supporting region 102 of the readily processed device.

For example, the first metallization 304 may be structured (e.g. include one or more openings) to provide the one or more trenches of the separator structure 508. Alternatively or additionally, the second metallization 306 may be structured (e.g. include one or more openings) to provide the one or more trenches of the separator structure 508.

Optionally, the electrically insulating base layer 302 may be structured (e.g. include one or more openings) to provide the one or more trenches of the separator structure 508, e.g. if the one or more trenches of the separator structure 508 extend through the chip carrier 500a. Alternatively the electrically insulating base layer 302 may be exposed by the separator structure 508.

FIG. 5B shows schematically a chip carrier 500b according to various embodiments in a front view or a cross sectional view (similar to FIG. 2A). The chip carrier 500b may be configured similar the any of the chip carrier 100b, 100c, 100d, 300b, 300c, 300d.

As illustrated in FIG. 5A, the recess 104r (on the first side) may expose the at least one contact pad 104c (e.g. two contact pads) and optionally the electrical lines 514 of the chip carrier 500b partially.

Figure 6A:
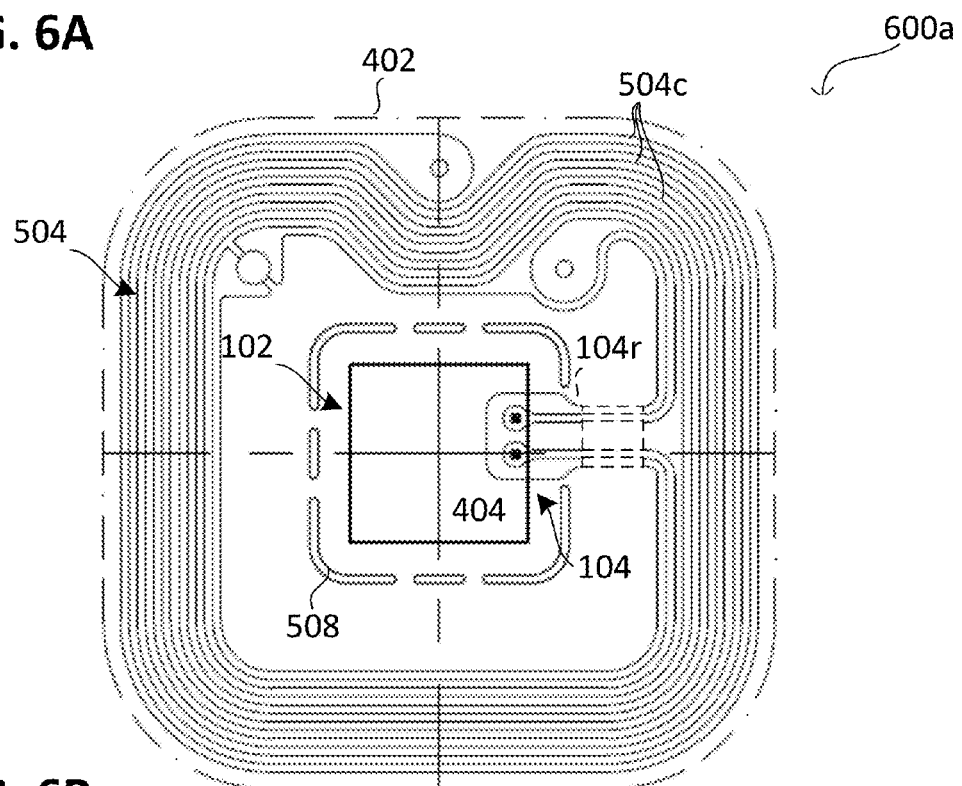
FIG. 6A shows schematically a device according to various embodiments in a front view or a cross sectional view.

FIG. 6A illustrates schematically a device 600a according to various embodiments in a front view or a cross sectional view (similar to FIG. 2A). The device 600a may include a chip carrier 402 and a chip 404. The chip carrier 402 may be configured similar to any of the chip carriers described herein, e.g. any of the chip carriers 100a to 100d, of the chip carriers 300a to 300d, the chip carriers 500a, 500b.

According to various embodiments, the chip carrier 402 may include at least one recess 104r at least one of: on the first side of the chip carrier 402 (which is visible in FIG. 6A) or on the second side of the chip carrier 402 (which is hidden in the view of FIG. 6A). For example, the chip carrier 402 may include a recess 104r on the second side of the chip carrier 402 similar to the chip carriers 100a, 300a. Alternatively or additionally, the chip carrier 402 may include a recess 104r on the first side of the chip carrier 402 similar to the chip carriers 100b to 100d and 300b to 300d (illustrated as dashed lines).

The chip 404 is illustrated semitransparent to show the chip contacting region 104 which is at least partially covered by the chip 404. The chip 404 may be configured according to a predetermined functionality, e.g. to implement the predetermined functionality together with the circuit region 504, e.g. the circuit structure 504c formed therein. The predetermined functionality may include or be formed from at one of the following: contactless-communication, documentation, authentication, data storage, and application processing. For example, the chip 404 may be configured to implement a contactless-communication together with the circuit region 504, e.g. the circuit structure 504c formed therein.

Figure 6B:
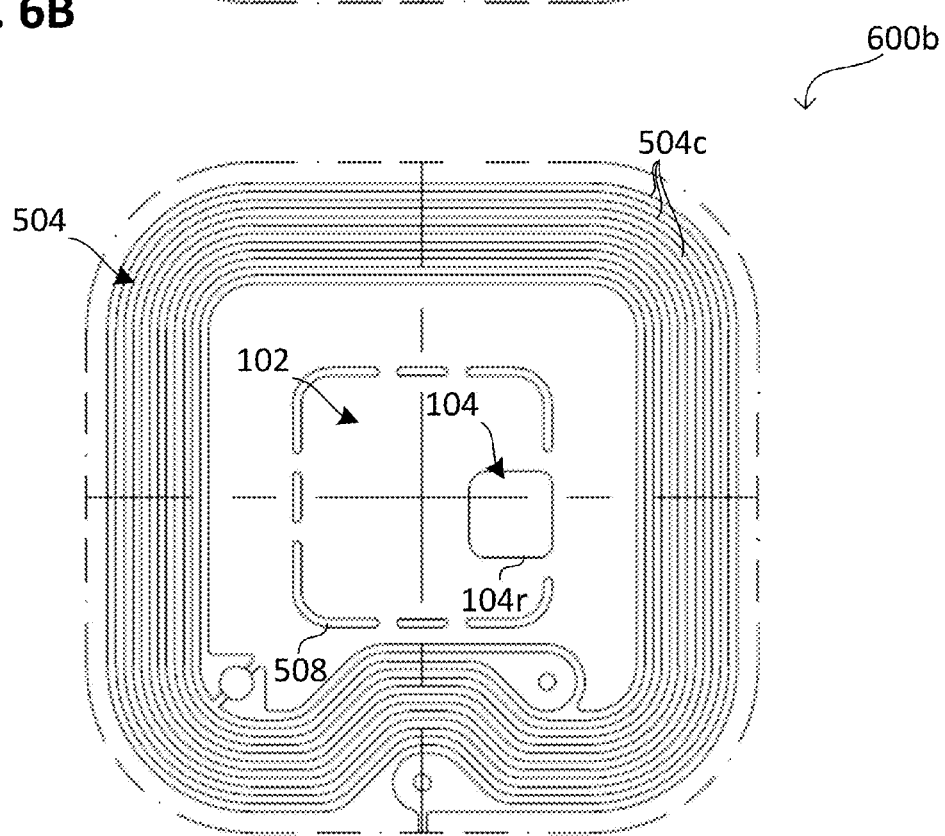
FIG. 6B shows schematically a device according to various embodiments in back view or a cross sectional view.

FIG. 6B shows schematically a chip carrier 600b according to various embodiments in a back view or a cross sectional view (e.g. on the second side). The chip carrier 600b may be configured similar to any of the chip carriers described herein, e.g. any of the chip carriers 100a to 100d, of the chip carriers 300a to 300d, the chip carriers 500a, 500b, the chip carrier 402.

According to various embodiments, the chip carrier 600b may include a recess 104r on the second side of the chip carrier 600b. Optionally, the chip carrier 600b may include a further recess 104r on the first side of the chip carrier 600b (hidden in this view).

According to various embodiments, the separator structure 508 may be formed on at least the second side of the chip carrier 600b, as illustrated in FIG. 6B. Optionally, the separator structure 508 may extend through the chip carrier 600b (that means from the first side to the second side). Alternatively, a further separator structure 508 may be formed on the first side of the chip carrier 600b (see FIG. 5A). In other words, the separator structure 508 may be formed on at least one of a first side of the chip carrier 600b or a second side of the chip carrier 600b opposite the first side. Alternatively, the separator structure may extend through the chip carrier 600b.

In analogy, at least one circuit structure 504c may be formed on at least one of: a side of the chip carrier 600b on which the at least one contact pad 104c is exposed (e.g. the first side); a side of the chip opposite the exposed side of the at least one contact pad 104c (e.g. the second side).

FIG. 7A and FIG. 7B respectively illustrate schematically a device 700a according to various embodiments, wherein FIG. 7B shows the device 700a in a front view (similar to FIG. 2A, e.g. viewed on the first side) and FIG. 7A shows the device 700a in a cross sectional view 701. The device may include a chip carrier 402, as described before and a chip 404, e.g. configured similar to at least one of the chip carrier 100a, the chip carrier 300a.

According to various embodiments, the chip carrier 402 may be free of metal on its second side (opposite the contact surface 104s) at least in the connecting region 314 and optionally in the chip contacting region 104. This may provide a displaceable chip contacting region 104.

By pressing the chip 404 on the chip carrier 402, the at least one contact protrusion 404p of the chip 404 may physically contact the at least one contact pad 104c and transfer a mechanical load, e.g. a force, to the chip contacting region 104. The mechanical load may move the chip contacting region 104 out of a reference position it had before the mechanical load was applied to the chip contacting region 104. Thereby the chip contacting region 104 may be displaced and the connecting region 314 may be deformed.

FIG. 8A illustrates a device 800a according to various embodiments in a cross sectional view, e.g. the device 700a in the cross sectional view 701. FIG. 8B illustrates a device 800b according to various embodiments in a cross sectional view, e.g. the device 700a in the cross sectional view 703.

The devices 800a, 800b may include an adhesive layer 802 disposed between the chip 404 and the chip carrier 402, e.g. between the chip 404 and at least one of: the chip contacting region 104, the chip supporting region 102. The adhesive layer 802 may be configured to adhere the chip 404 to the chip carrier 402, e.g. to at least one of: the chip contacting region 104, the chip supporting region 102. A layer thickness 802d of the adhesive layer 802 between the chip 404 and the chip supporting region 102 may be substantially homogeneous along a path following the perimeter 404r of the chip (that means between the chip supporting region 102 and a rim of the chip 404). In other words, layer thickness 802d of the adhesive layer 802 between the chip 404 and the chip supporting region 102 may be substantially constant along a path following the perimeter 404r of the chip. In other words, a thickness 802d of the adhesive layer 802 between the chip 404 and the chip carrier 402 may be substantially homogeneous along the perimeter of the chip 404. Alternatively or additionally, a thickness 802d of the adhesive layer 802 between the chip 404 and the chip carrier 402 may be substantially homogeneous along adhesive layer 802 linear path (for example, along at least one of the cross section 701, the cross section 703) through the at least one contact protrusion 404p. The linear path may be parallel to the first support surface 102t.

For example, a relative deviation of the layer thickness 802d of the adhesive layer 802 (e.g. along at least one of the perimeter of the chip 404, the linear path) may be smaller than about 50%, e.g. smaller than about 40%, e.g. smaller than about 30%, e.g. smaller than about 20%, e.g. smaller than about 10%, e.g. smaller than about 5%, e.g. about 0% (constant). A relative deviation may be understood as deviation of a value relative to its average (value).

According to various embodiments, a sum of the first thickness 104d and the protrusion height 404d substantially equals a sum of the second thickness 102t and the layer thickness 802d of the adhesive layer 802. In this case the third support surface 104b may be planar with the second support surface 102b. The term substantially equals may be understood as a difference between two values substantially equaling to each other may be smaller than about 50% of one of the values, e.g. smaller than about 40%, e.g. smaller than about 30%, e.g. smaller than about 20%, e.g. smaller than about 10%, e.g. smaller than about 5%, e.g. about 0% (equal).

Illustratively, a modified chip contacting region 104 (contact area) of the chip carrier 402 (substrate) may be provided. The recess 104r (window) in the chip contacting region 104 on the first side of the chip carrier 402 (illustratively, of the substrate's chip side) is slightly enlarged and on the second side (rear side) of the chip carrier 402 a further recess 104r may be disposed in the chip contacting region 104. In other words, the chip carrier 402 may include an opening in the chip contacting region 104 on at least one of the first side, the second side.

For adhering the chip 404 to the chip carrier 402, the adhesive layer 802 may be cured, e.g. by heating the adhesive layer 802 (e.g. at least 10 seconds while pressing). The adhesive layer 802 may include or be formed from an adhesive material, e.g. a polymer adhesive, e.g. an epoxy adhesive. Optionally, the adhesive layer 802 may include or be formed from the same material like the spacer layer 308. Illustratively, the spacer layer 308 and the adhesive layer 802 may be formed in a two-step curing process. In other words, the adhesive layer 802 may be formed after curing the spacer layer 308. The adhesive layer 802 may be formed using printing (e.g. screen print or ink printing). Alternatively or additionally, the adhesive layer 802 may be formed using a lamination process. Alternatively or additionally, the adhesive layer 802 may be formed using a photo-processable (e.g. lithography, photochemical).

Optionally, the adhesive layer 802 may include filler particles, e.g. electrically insulating particles. The filler particles may have an extension, e.g. a diameter, in the range from about 10 µm to about 50 µm, e.g. in the range from about 20 µm to about 40 µm.

According to various embodiments, the properties of the connecting region 314 (e.g. its flexible properties), may be defined by the electrically insulating base layer 302 (e.g. provided in form of a tape) in combination with the recess 104r design. According to various embodiments, a flat and uniform bonding of the chip 404 to the chip carrier 402 may be provided.

For adhering the chip 404 to the chip carrier 402, the chip 404 may be pressed against the chip carrier 402. Pressing the chip 404 against the chip carrier 402 may include forming a layer thickness 802d of the adhesive material 802 between the chip 404 and the chip supporting region 102 being substantially homogeneous along a path following the perimeter 404r of the chip 404. Optionally, pressing the chip 404 against the chip carrier 402 may include transferring thermal energy to the adhesive material 802 for heating the adhesive material 802. By heating the adhesive material 802 it may be cured.

Optionally, the pressing the chip against the chip carrier (e.g. the pressing force or pressing speed) is based on viscosity of the adhesive material.

Optionally, pressing the chip 404 against the chip carrier 402 may be based on a size of the filler particles in the adhesive layer 802. For example, the chip may be wobbled to induce the filler particles removing from a region between the at least one contact pad 104c and the at least one contact protrusion 404p.

Optionally, pressing the chip 404 against the chip carrier 402 may include displacing the chip contacting region 104 (e.g. the at least one contact pad 104c) by deforming the chip carrier 402 (e.g. in its connecting region 314) to form a recess 104r (on the first side) in which the at least one contact protrusion 404p may be received.

Optionally, the chip carrier 402 may include an electrically insulating base layer over which the at least one contact pad 104c is formed on a first side of the chip carrier 402, e.g. similar to the chip carrier 300a.

Optionally, the chip carrier 402 may include an electrically insulating base layer 302 over which a first metallization 304 (eh including the at least one contact pad 104c) is formed on the first side of the chip carrier 402, e.g. similar to the chip carriers 300a to 300d. Alternatively or additionally, the chip carrier 402 may include an electrically insulating base layer over which the second metallization 306 is formed on the second side of the chip carrier 402, e.g. similar to the chip carriers 300a to 300d.

The chip carrier 402 may include an opening 814 (see also FIG. 1A) opposite the at least one contact pad 104c (e.g. in the second metallization 306, e.g. similar to FIG. 3A). For example, the electrically insulating base layer 302 may be exposed by the opening 814. For example, the chip contacting region 104 may be free from metal on the second side. Optionally the connection region 314 may be free from metal on the first side and the second side.

FIG. 9A illustrates schematically a device 900a according to various embodiments in a cross sectional view (similar to FIG. 8A) in a method according to various embodiments. FIG. 9B illustrates schematically a device 900b according to various embodiments in a cross sectional view (similar to FIG. 8A) in a method according to various embodiments. As described before, the chip carrier 402 may include the recess 104r on the first side of the substrate carrier 402 in its chip contacting region 104.

For example, the substrate carrier 402 may include one recess 114r for each contact pad of the at least one contact pad 104c, e.g. two recesses 114r, as illustrated in FIG. 9A and FIG. 9B, or more than two recesses 114r.

Optionally, the chip carrier 402 may include an electrically insulating base layer over which the at least one contact pad 104c is formed on a second side of the chip carrier 402, as illustrated in FIG. 8A and FIG. 8B, e.g. similar to the chip carriers 300b to 300d (see for example, FIG. 3C and FIG. 3D).

Optionally, the chip carrier 402 may include an electrically insulating base layer over which a first metallization is formed on the first side of the chip carrier 402, e.g. similar to the chip carriers 300a to 300d. Alternatively or additionally, the chip carrier 402 may include an electrically insulating base layer over which the second metallization (e.g. including the at least one contact pad 104c) is formed on the second side of the chip carrier 402, e.g. similar to the chip carriers 300a to 300d.

According to various embodiments, the electrically insulating base layer 302 is opened in the chip contacting region 104 to provide the recess 104r in the chip carrier 300c and 300d, as illustrated in FIG. 8A, e.g. similar to FIG. 3C and FIG. 3D. In this case, the at least one contact pad 104c is at least one of disposed in (see FIG. 1B) or at least partially exposed (see FIG. 1C and FIG. 1D) by the recess 104r.

Illustratively, the chip carrier 402 base material includes at least one recess 114r (terminal hole) in the chip contacting region 104. The at least one recess 114r (in other words, one or more recesses 114r) may receive the at least one contact protrusion 404p (e.g. stud bumps), such that the at least one contact pad 104c may physically contact the at least one contact pad 104c (e.g. its contact surface 104s). For example, the at least one contact pad 104c may be disposed on a side opposite the chip 404, as illustrated in FIG. 9A, wherein the at least one contact protrusion 404p contacts an inner side of the at least one contact pad 104c. For example, the contact pad 104c may be provided by the second metallization which is disposed opposite the chip 404 (illustratively, the rear side metal of the chip carrier 402), see for example FIG. 3C and FIG. 3D.

On the one hand, forming the recess 104r exposing the inner side of the at least one contact pad 104c (see FIG. 9A) may need more process steps compared the chip carrier 402 illustrated in FIG. 8A. On the other hand, a deeper recess 104r may be provided exposing the inner side of the at least one contact pad 104c (see FIG. 9A) compared the chip carrier 402 illustrated in FIG. 8A. Therefore, greater protrusion height may be received.

Alternatively or additionally, the spacer layer 308 (for example, a solderstop on the chip side of the substrate carrier 402), e.g. solderstop mask, may be disposed on the first side (chip side) of the chip carrier 402. Illustratively, the spacer layer 308 may provide a uniform flat surface for attaching the chip 404. The at least one contact protrusion 404p extends into the at least one recess 104r provided by the spacer layer 308. The second portion 104 may be disposed over (e.g. the contacting) the first side metallization (also referred to as first metallization) of the chip carrier 402.

On the one hand, forming the spacer layer 308 may need more process steps compared the chip carrier 402 illustrated in FIG. 8A. On the other hand, a deeper recess 104r may be provided by the spacer layer 308 (see FIG. 9B) compared the chip carrier 402 illustrated in FIG. 8A. Optionally, the thickness 308d of the spacer layer 308 (at least in the chip supporting region 102) may be adapted to a broad variety of chip 404 designs, e.g. to a broad variety protrusion heights. In other words, the depth of the at least one recess 104r may be adjusted by the thickness 308d of the spacer layer 308 according to the protrusion height of a certain chip 404 design.

For example, a greater protrusion height may be received using the spacer layer 308 compared the chip carrier 402 illustrated in FIG. 8A. Alternatively, also a smaller protrusion height may be received using the spacer layer 308 compared the chip carrier 402 illustrated in FIG. 8A. The spacer layer 308 may reduce the thermal coupling between the chip 404 and the chip carrier 402, which may influence the performance (e.g. thermal performance) of chip 404 including a high power element (e.g. a power device). For increasing the thermal coupling between the chip 404 and the chip carrier 402, the spacer layer 308 may include thermal conducting spacer particles (e.g. electrically conducting or electrically insulating), e.g. spacer particles including or formed from carbon.

Figure 10A:
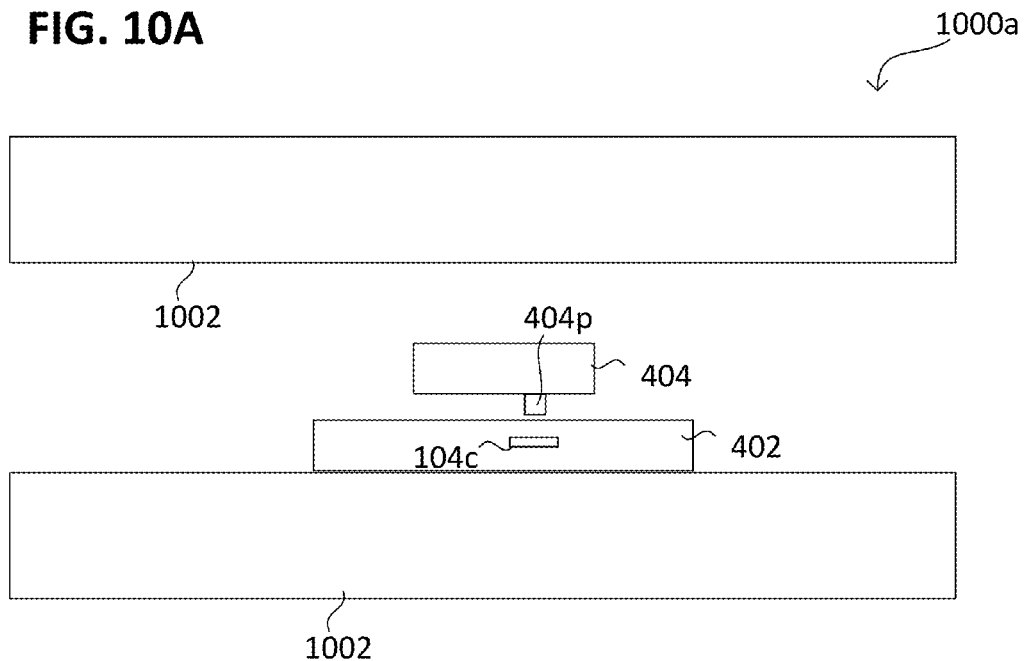
FIG. 10A and FIG. 10B respectively show schematically a device according to various embodiments in a cross sectional view in a method according to various embodiments.
Figure 10B:
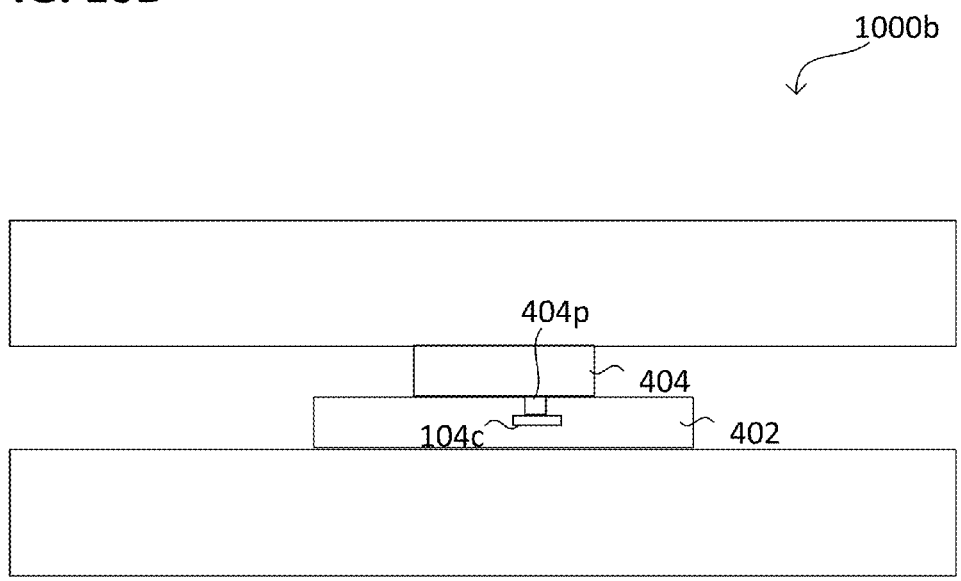

FIG. 10A and FIG. 10B respectively show schematically a device according to various embodiments in a cross sectional view in a method according to various embodiments.

The method may include in 1000a providing chip carrier 402. The chip carrier 402 may be configured as described herein, e.g. including a thinned chip contacting region, such that a first thickness of the chip carrier at the at least one contact pad is smaller than a second thickness of the chip carrier in the chip supporting region. The method may further include in 1000a disposing a chip 404 including at least one contact protrusion 404p over the chip carrier 402, such that the at least one contact protrusion 404p is arranged over the chip contacting region 104 (e.g. over the at least one contact pad of the chip carrier 402.

The method may include in 1000b pressing the chip 404 against the chip carrier 402 (also referred to as pressing process) such that the at least one contact protrusion 404p is moved into the chip carrier 402, e.g. into its chip contacting region 104, e.g. into a recess provided or formed therein. In other words, by pressing the chip 404 against the chip carrier 402 the at least one contact protrusion 404p may extend at least partially into the chip carrier 402, e.g. into its chip contacting region 104, e.g. into a recess provided or formed therein. By pressing the chip 404 against the chip carrier 402, the at least one contact protrusion 404p may be at least one of physically contacted or electrically contacted to the at least one contact pad 104c.

The method may optionally include disposing an adhesive material (not shown) between the chip 404 and the chip carrier 402 (e.g. its chip supporting region), wherein the adhesive material is configured to adhere the chip 404 to the chip supporting region. The pressing may be configured that the adhesive material forms an adhesive layer between the chip 404 and the chip carrier 402 (e.g. at least in its chip supporting region). The pressing may be further configured that a layer thickness of the adhesive material (illustratively, the thickness of the adhesive layer) between the chip 404 and the chip carrier 402 (e.g. its chip supporting region) is substantially homogeneous along at least one of: a path following the perimeter 404r of the chip, a linear path through the at least one contact protrusion 404p (illustratively, providing a uniform glue height). In other words, the chip 404 may be substantially aligned parallel to the chip supporting region 102.

Optionally, pressing the chip 404 against the chip carrier 402 is based on at least one of: a difference between the first thickness and the second thickness; a protrusion height of the contact protrusion. In other words, pressing the chip 404 may be configured to adjust the layer thickness of the adhesive layer (in other words, the distance of the chip 404 from the first support surface) based on at least one of: a difference between the first thickness and the second thickness; a protrusion height of the contact protrusion, e.g. such, that a sum of the first thickness and the protrusion height substantially equals a sum of the second thickness and the thickness of the adhesive layer.

For example, pressing the chip 404 against the chip carrier 402 may be based on the depth of the recess (on at least one of the first side, the second side) and the protrusion height. The difference of the depth of the recess and the protrusion height may define an intended thickness of the adhesive layer. Pressing the chip 404 against the chip carrier 402 may be based on the intended thickness of the adhesive layer. For example, pressing the chip 404 against the chip carrier 402 may be stopped when the current thickness of the adhesive layer equals substantially the intended thickness of the adhesive layer. The protrusion height may be in the range from about 25 µm to about 35 µm. The depth of the recess may be in the range from about 10 µm to about 50 µm, e.g. in the range from about 20 µm to about 40 µm.

Alternatively or additionally, forming the at least one contact protrusion 404p may be based at least one of: the depth of the recess (on at least one of the first side, the second side) and a predetermined thickness of the adhesive layer. The predetermined thickness of the adhesive layer may be defined by the physical properties of the adhesive material (e.g. viscosity, filler particles, etc.). For example, the difference between the depth of the recess and a predetermined thickness may define an intended protrusion height. For example, forming the at least one contact protrusion may include forming a protrusion height of at least one contact protrusion substantially equal to the intended protrusion height. For example, the intended protrusion height may be in the range from about 25 µm to about 35 µm. The predetermined thickness may be in the range from about 1 µm to about 20 µm, e.g. in the range from about 5 µm to about 10 µm.

Optionally, pressing the chip 404 against the chip carrier 402 includes transferring a pressing force to the chip 404, wherein the pressing force is based on a difference between the first thickness and the second thickness. For example, the pressing force may be configured to adjust the layer thickness of the adhesive layer (in other words, the distance of the chip 404 from the first support surface) such, that a sum of the first thickness and the protrusion height substantially equals a sum of the second thickness and the layer thickness of the adhesive layer.

Optionally, providing the chip carrier 402 includes disposing the chip carrier 402 on a first support element 1002. The first support element 1002 may include a planar surface on which the chip carrier 402 is disposed, e.g. in contact with the planar surface of the first support element 1002.

Optionally, pressing the chip 404 against the chip carrier 402 includes applying a second support element 1004 to the chip 404 for transferring a pressing force to the chip 404. For example, the chip 404 and the chip carrier 402 may be disposed between the first support element 1002 and the second support element 1004. For pressing the chip 404 against the chip carrier 402 a distance between the first support element 1002 and the second support element 1004 may be reduced until the second support element 1004 gets into physical contact with the chip 404. Therefore, the second support element 1004 may include a planar surface which gets into physical contact with the chip 404. For pressing the chip 404 against the chip carrier 402 the first support element 1002 and the second support element 1004 may transfer a pressing force to the chip 404 and the chip carrier 402.

According to various embodiments, pressing the chip 404 against the chip carrier 402 includes aligning the chip substantially parallel to the chip supporting region 102 of the chip carrier 402, e.g. to the first support surface. In other words, a distance of the chip 404 from the chip supporting region 102 (illustratively a gap) may be homogeneous along at least one of: a path following the perimeter 404r of the chip, a linear path through the at least one contact protrusion 404p (illustratively, providing a uniform gap height).

This may be achieved by aligning the first support surface parallel to the planar surface of the first support element 1002 and aligning the chip 404 (e.g. its surface facing the chip carrier 402) also parallel to the planar surface of the second support element 1002. This may be achieved by additionally aligning the planar surface of the first support element 1002 parallel to the planar surface of the second support element 1002.

Optionally, pressing the chip 404 against the chip carrier 402 includes transferring thermal energy to at least one of the chip 404 or the chip carrier 402, for transferring thermal energy to an adhesive material (for heating the adhesive material) disposed in the gap. This may enable to cure the adhesive material (also referred to as curing process). Transferring thermal energy may include heating at least one of first support element 1002 or second support element 1004. Therefore at least one of first support element 1002 or second support element 1004 may be configured to generate heat energy (illustratively, at least one of first support element 1002 or second support element 1004 may be configured as thermode). At least one of the first support element 1002 or the second support element 1004 may be part of a curing station.

The adhesive material may be at least one of a nonconductive adhesive material (insulating adhesive material) or a conductive adhesive material, e.g. an anisotropic conductive adhesive material (e.g. including electrically conducting filler particles).

Optionally, pressing the chip 404 against the chip carrier 402 (e.g. at least one of the pressing force or the pressing speed) is based on viscosity of the adhesive material. The greater the viscosity of the adhesive material the smaller at least one of the following may be: the pressing force or the pressing speed.

In case, the substrate carrier 402 includes a connecting region 314, at least one of the pressing process or the curing process (of the adhesive layer), may include deforming the substrate carrier 402 (e.g. bending) directional towards the second side of the chip carrier 402 in the connecting region (contact area window region) such that the third support surface (e.g. provided by the electrically insulating base layer 302) gets in physical contact with the first support element 1002 (illustratively, rear side thermode).

When the adhesive layer (e.g. its adhesive material, e.g. being a glue material) is cured (illustratively, after the curing process), the chip 404 and the chip carrier 402 may be fixed in its relative position to each other. In other words, the chip/chip carrier arrangement is fixed in a position defined by the distance of the second support element 1004 from the first support element 1002. Illustratively, the most or substantially all bending stress to the chip 404 (e.g. at least one of in cross sectional direction 701 or in cross sectional direction 703) may be avoided by this procedure.

According to various embodiments, the protrusion height may result from an appropriate selection of the contact bump height regarding the metal thickness (thickness of the second metallization) on the chip carrier chip side and back side, e.g. the chip may be arranged on the substrate as shown in FIG. 4A. The chip is glued to the at least one contact pad (at least one die pad) with a uniform glue height in the long direction (see FIG. 7B, line 701) and also in the cross direction (see FIG. 7B: line 703). In addition, the bending stress in cross direction is avoided by this arrangement.

For example, the chip 404 and the chip carrier 402 may be permanently joined in a final adhesive material (illustratively, glue) curing step by pressing the composite with hot thermodes 1002, 1004 from the first side and the second side of the chip carrier 402. The adhesive material cures and fixes the chip 404 on the chip carrier 402, while the at least one contact protrusion 404p realize the electrical contact between chip 404 and the chip carrier 402 (illustratively, being a press contact).

Optionally, pressing the chip 404 against the chip carrier 402 may include reducing a layer thickness of the adhesive material. For example, the layer thickness before (prior) pressing may be in the range from about 10 µm to about 50 µm, e.g. in the range from about 20 µm to about 40 µm. For example, the layer thickness after pressing may be in the range from about 1 µm to about 20 µm, e.g. in the range from about 5 µm to about 10 µm. For example, pressing the chip 404 against the chip carrier 402 may include reducing the layer thickness of the adhesive material by at least about 50%.

According to various embodiments, the method may be used for a batch process for forming more than one device simultaneously, e.g. more than or equal to 8 devices, more than or equal to 16 devices, e.g. more than or equal to 32 devices.

FIG. 11A to FIG. 11D respectively show schematically a chip carrier according to various embodiments in a cross sectional view in a method according to various embodiments.

Illustratively, for forming the chip carrier, the openings (later providing the one or more recess 104r) may be formed before at least one of the first metallization 304 or the second metallization 306 (rear side metal) is laminated on the electrically insulating base layer 302. For example, the opening may be configured such that the chip contacting region 104 on the second side is metal free, e.g. in order to receive the at least one contact protrusion. This may avoid impairing deformations related to the protrusion height, e.g. in terms of device (module) stability and thermal performance of the device.

The method may include in 1100a providing an electrically insulating base layer 302. The method may include in 1100b forming an opening 1102 through the electrically insulating base layer 302. Forming an opening 1102 through the electrically insulating base layer 302 may include or be formed from at least one of punching, etching, laser ablation.

The method may include in 1100c laminating (attaching) a back side metallization 306 (also referred to as second metallization 306) on a back side (also referred to as second side) of the electrically insulating base layer 302. Laminating (attaching) the back side metallization 306 may include covering the opening 1102 on the back side. The method may include in 1100d laminating (attaching) a front side metallization 304 (also referred to as first metallization 304) on a front side (also referred to as first side) of the electrically insulating base layer 302. In the front side metallization 304 a further opening 1104 may be formed. Forming the opening 1104 in the front side metallization 304 may include or be formed from at least one of punching, etching, laser ablation.

According to various embodiments, the further opening 1104 may be formed in the front side metallization 304 prior to laminating the front side metallization 304 to the electrically insulating base layer 302. In this case, laminating the front side metallization 304 may be configured such that the further opening 1104 is disposed over the opening 1102.

Alternatively, the further opening 1104 may be formed after laminating the front side metallization 304 to the electrically insulating base layer 302. In this case, forming the further opening 1104 may include forming the further opening 1104 over the opening 1102. The opening 1102 and the further opening 1104 may provide a recess 104r for receiving at least one contact protrusion.

According to various embodiments, in analogy at least one further recess may be formed according the method.

Optionally, the method may include forming at least one contact pad at least one of exposed by or disposed in the recess 104r.

FIG. 12A to FIG. 12D respectively show schematically a chip carrier according to various embodiments in a cross sectional view in a method according to various embodiments.

The method may include in 1200a providing an electrically insulating base layer 302. The method may further include in 1200b laminating a first metallization 304 on a first side of the electrically insulating base layer 302.

The method may further include in 1200c structuring the first metallization 304 to form at least one contact pad 104c. Structuring the first metallization 304 may include forming an opening 304e through the first metallization 304, wherein the opening 304e may partially surround the at least one contact pad 104c. In other words, forming the at least one contact pad 104c includes forming a metallization layer 304 (also referred to as first metallization 304) in the chip contacting region and structuring the metallization layer 304. Structuring the first metallization 304 may include using at least one of a mask (e.g. photolithography), an etching process, laser ablation. Structuring the first metallization 304 may include forming one or more additionally layers on the first metallization 304 (e.g. after forming the opening 304e), e.g. using plating (e.g. using a galvanic process). The one or more additionally layers may include or be formed from a metal, e.g. at least one of nickel or copper.

The method may further include in 1200d laminating a second metallization 306 on a second side of the electrically insulating base layer 302. In the second metallization 306 an opening 1204 may be formed. Forming the opening 1204 may include or be formed from at least one of punching, etching, laser ablation.

According to various embodiments, the opening 1204 may be formed prior to laminating the second metallization 306 to the electrically insulating base layer 302. In this case, laminating second metallization 306 may be configured such that the opening 1204 is disposed over the at least one contact pad 104c on the second side.

Alternatively, the further opening 1204 may be formed after laminating the second metallization 306 to the electrically insulating base layer 302. In this case, forming opening 1204 may include forming the opening 1204 over the at least one contact pad 104c on the second side. The opening 1204 may provide a recess 104r for receiving at least one contact protrusion.

Figure 13A:
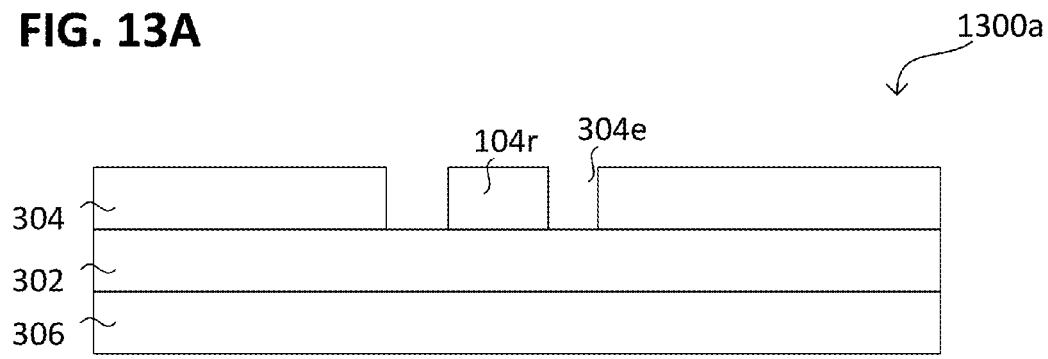
FIG. 13A to FIG. 13D respectively show schematically a chip carrier according to various embodiments in a cross sectional view in a method according to various embodiments.
Figure 13B:
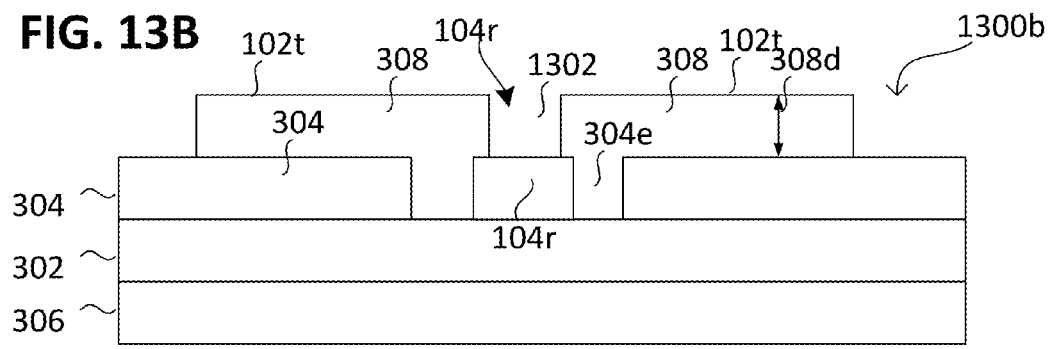

FIG. 13A and FIG. 13B respectively illustrate schematically a chip carrier according to various embodiments in a cross sectional view in a method according to various embodiments.

The method may include in 1300a providing a chip carrier in a processing stage similar to 1200c (see FIG. 1200b). The method may further include in 1300a laminating a second metallization 306 on a second side of the electrically insulating base layer 302. Optionally an opening (not shown) may be formed in the second metallization 306, similar to 1200d. The method may further include in 1300b forming a spacer layer 308 over the first metallization 304. In the spacer layer 308 an opening 1302 may be formed, e.g. using a mask. The opening 1302 may expose the at least one contact pad 104c at least partially (partially or completely). The opening 1302 may expose the opening 304e in the first metallization 304, e.g. if an opening is formed in the second metallization 306 similar to 1200d. In other words, the spacer layer 308 may be used in combination with the connecting region 314.

Optionally, the method may include in 1300b adjusting the thickness 308d of the spacer layer 308 according to a protrusion height of a chip to be received over the chip carrier.

Forming the spacer layer 308 may include forming a planar surface of the spacer layer 308 for providing a first support surface 102t.

The opening 1302 may provide the recess 104r for receiving at least one contact protrusion 404p. In other words, the method may include opening the spacer layer 308 for providing the recess 104r.

Figure 13C:
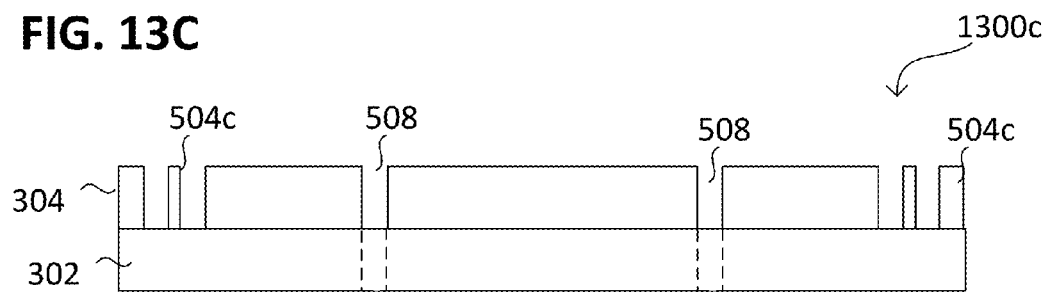
Figure 13D:
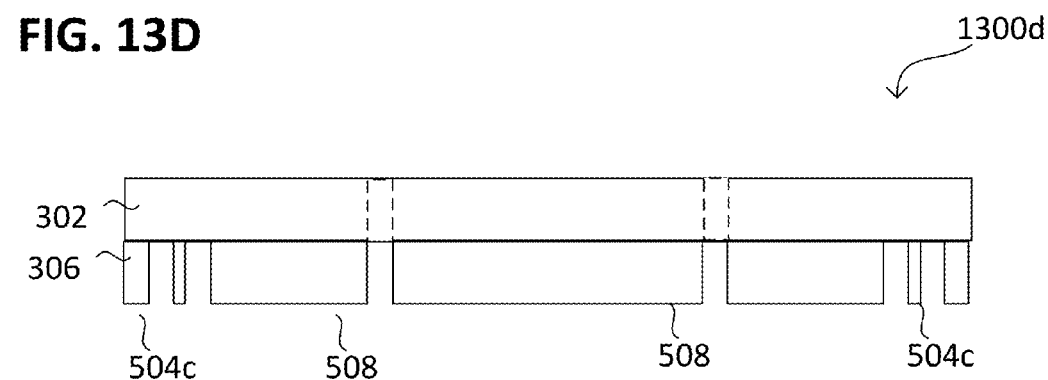

FIG. 13C and FIG. 13D respectively show schematically a chip carrier according to various embodiments in a cross sectional view in a method according to various embodiments, e.g. additionally one of the methods described herein, e.g. to at least one of the method 1100a to 1100d, the method 1200a to 1200d, the method 1300a to 1300a, as described before.

The method may include in 1300c forming a circuit structure 504c by structuring the first metallization 304. Alternatively or additionally, the method may include in 1300c forming a separator structure 508 by structuring the first metallization 304. The separator structure 508 may optionally extend at least through the first metallization 304.

Optionally, forming the separator structure 508 may include structuring the electrically insulating base layer 302. In other words, the separator structure 508 may optionally extend at least through the electrically insulating base layer 302.

In an additionally or alternative step, the method may include in 1300d forming a circuit structure 504c by structuring the second metallization 306. Alternatively or additionally, the method may include in 1300c forming a separator structure 508 by structuring the second metallization 306. The separator structure 508 may optionally extend at least through the second metallization 306.

Optionally, forming the separator structure 508 may include structuring the electrically insulating base layer 302. In other words, the separator structure 508 may optionally extend at least through the electrically insulating base layer 302.

Figure 14:
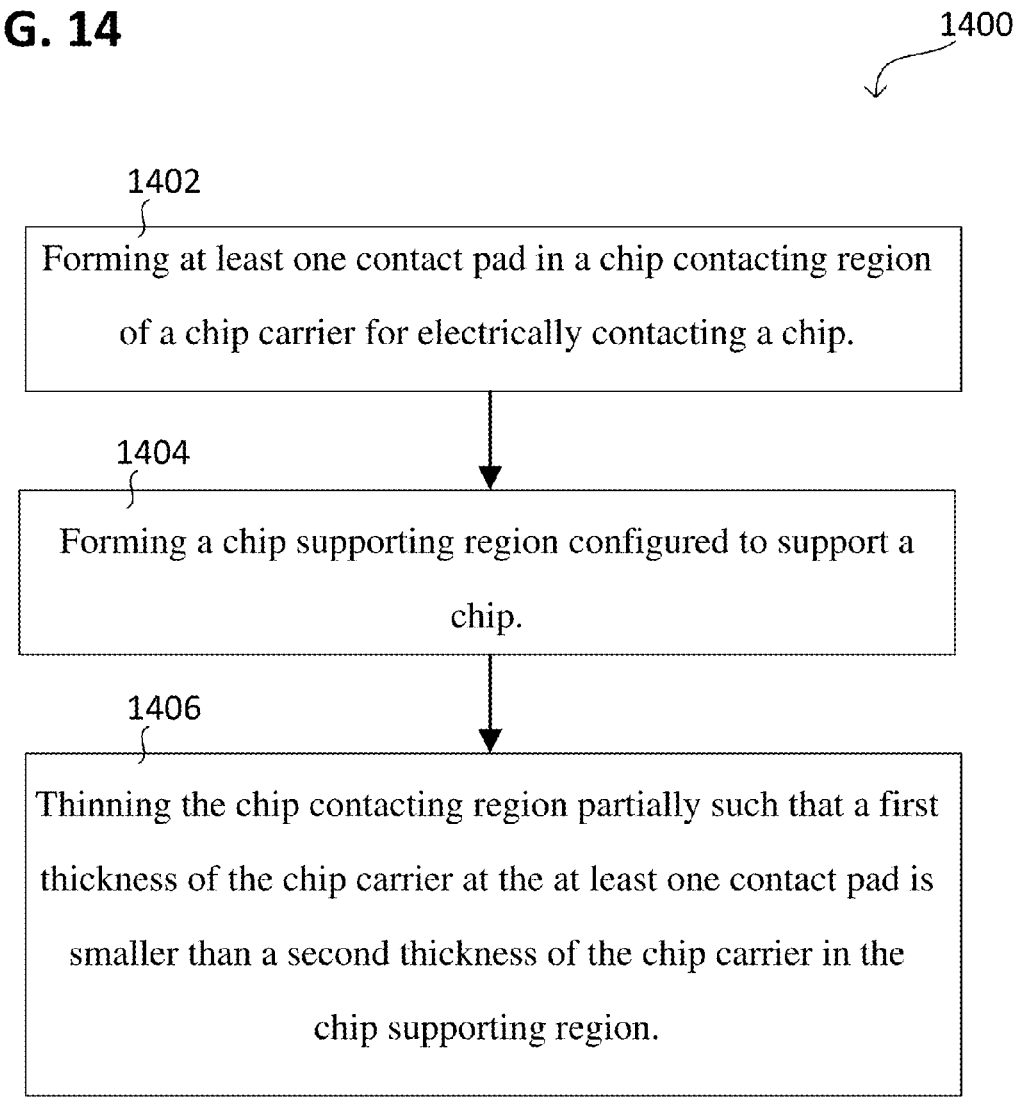
FIG. 14 shows a method according to various embodiments in an schematically flow diagram.
Figure 15A:
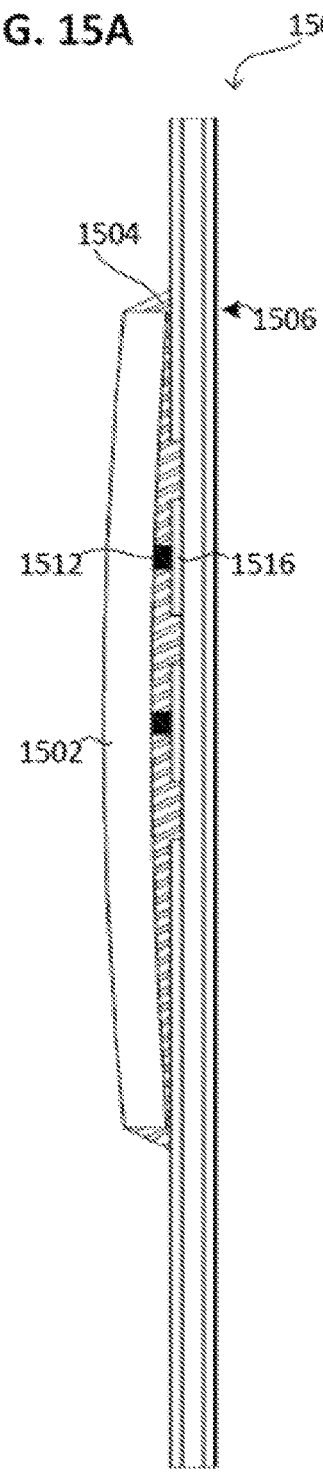
FIG. 15A and FIG. 15B respectively show a conventional device.
Figure 15B:
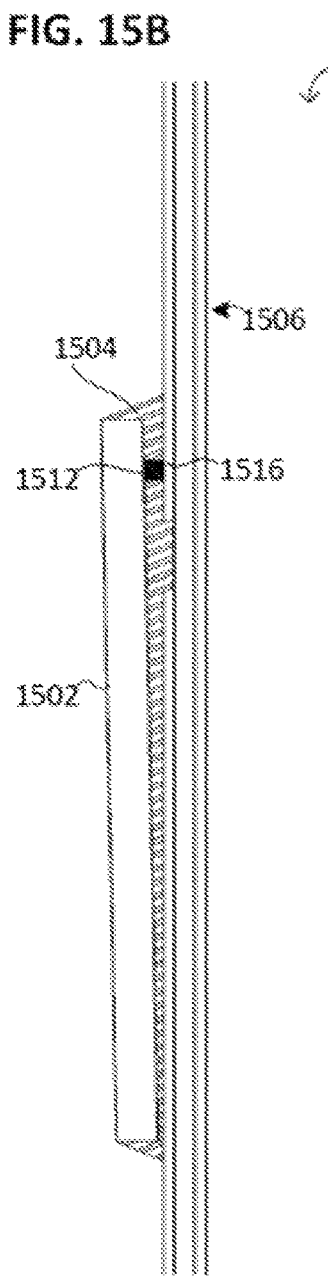

FIG. 14 illustrates a method 1400 according to various embodiments in an schematically flow diagram;

The method 1400 may include in 1402 forming at least one contact pad in a chip contacting region of a chip carrier for electrically contacting a chip. The method 1400 may further include in 1404 forming a chip supporting region configured to support a chip. The method 1400 may further include in 1406 thinning the chip contacting region partially such that a first thickness of the chip carrier at the at least one contact pad is smaller than a second thickness of the chip carrier in the chip supporting region.

According to various embodiments, thinning the chip contacting region includes forming a recess in the chip carrier opposite the at least one contact pad (see for example, step 1200d, see for example, FIG. 1A, FIG. 3A).

Alternatively or additionally, thinning the chip contacting region includes forming a recess in the chip carrier, wherein the at least one contact pad is at least one of formed in or at least partially exposed by the recess (see for example, step 1300b, see step 1100d, see FIG. 1B to FIG. 1D, see FIG. 3B to FIG. 3D).

According to various embodiments, thinning the chip contacting region may include forming a recess in at least one of: a base layer of the chip carrier (see step 1100c), a metallization of the chip carrier (see step 1100d, see step 1200d).

According to various embodiments, thinning the chip contacting region may include etching the chip carrier.

According to various embodiments, etching (or an etching procedure) may include at least one of dry etching, plasma etching, wet etching, ion etching. Optionally etching may include using a mask, e.g. a photomask.

Alternatively, thinning the chip contacting region may include plastically deforming the chip carrier prior to disposing a chip over the chip carrier. For example, deforming the chip carrier may include flatten a lead frame in the chip contacting region 104 (e.g. to from 50 µm to about 30 µm). Alternatively or additionally, deforming the chip carrier may include coining a lead frame in the chip contacting region 104.

According to various embodiments, forming at least one contact pad includes punching the chip carrier, e.g. if the chip carrier includes or is formed from a lead frame.

According to various embodiments, thinning the chip contacting region includes forming an opening into a base layer of the chip carrier (see step 1100b).

According to various embodiments, the method may further include forming a metallization layer in the chip contacting region which covers the opening of the base layer to provide a recess of the chip carrier (see step 1100c).

According to various embodiments, thinning the chip contacting region may include forming a second metallization opposite the at least one contact pad and opening the second metallization partially to form a recess (see step 1200d).

According to various embodiments, opening the second metallization in the chip contacting region to provide a recess in the chip carrier may include exposing the at least one contact pad. Alternatively or additionally, the method may include disposing the at least one contact pad in the recess.

According to various embodiments, the chip carrier may include or be formed from a foil, e.g. the foil may include or be formed from a laminate. The laminate may include or be formed from at least one base layer and at least one metallization. For example, the laminate may include or be formed from an electrically insulating base layer, a first metallization and a second metallization.

According to various embodiments, a method may include provide a chip carrier; forming at least one contact pad in a chip contacting region of a chip carrier for electrically contacting a chip; and thinning the chip contacting region (in other words, thinning the chip carrier in the chip contacting region) partially such that a first thickness of the chip carrier at the at least one contact pad is smaller than a second thickness of the chip carrier in the chip supporting region. The chip carrier may include or be formed from at least a base layer (e.g. an electrically insulating base layer) and a metallization, wherein the metallization may include or be formed from at least one of a first metallization (on a first side) and a second metallization (on a second side opposite the first side). The chip carrier may be provided having the base layer and at least one of a first metallization and a second metallization, e.g. as pre-product.

Figure 11A:
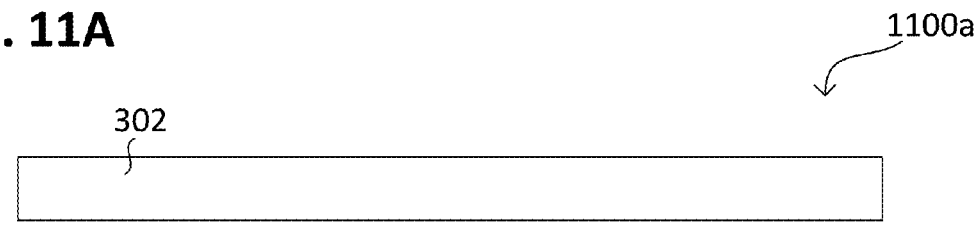
FIG. 11A to FIG. 11D respectively show schematically a chip carrier according to various embodiments in a cross sectional view in a method according to various embodiments.
Figure 11B:
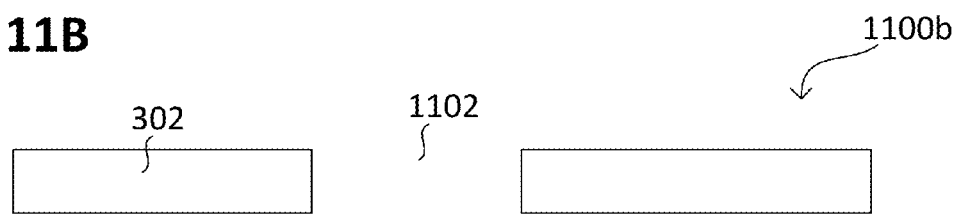
Figure 11C:
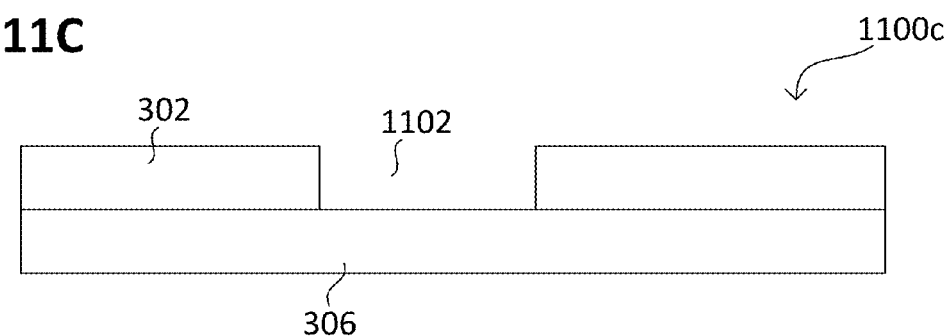
Figure 11D:
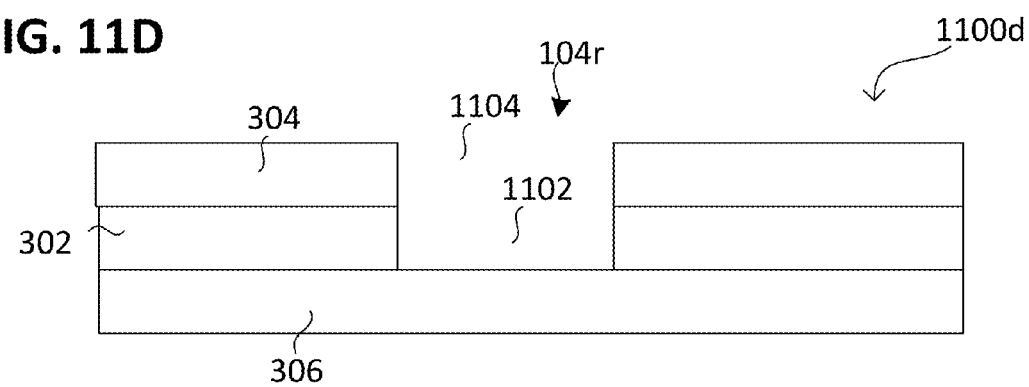
Figure 12A:
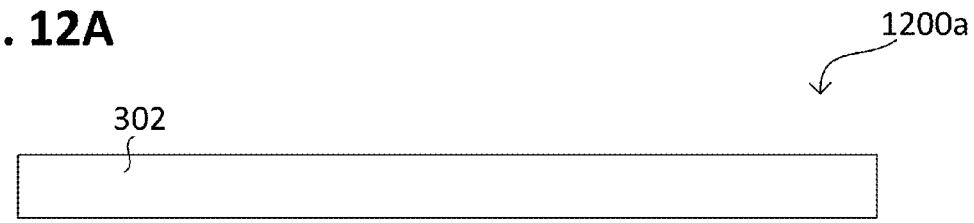
FIG. 12A to FIG. 12D respectively show schematically a chip carrier according to various embodiments in a cross sectional view in a method according to various embodiments.
Figure 12B:
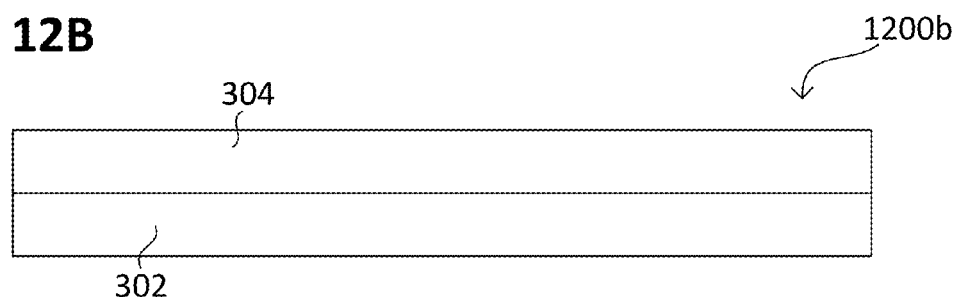
Figure 12C:
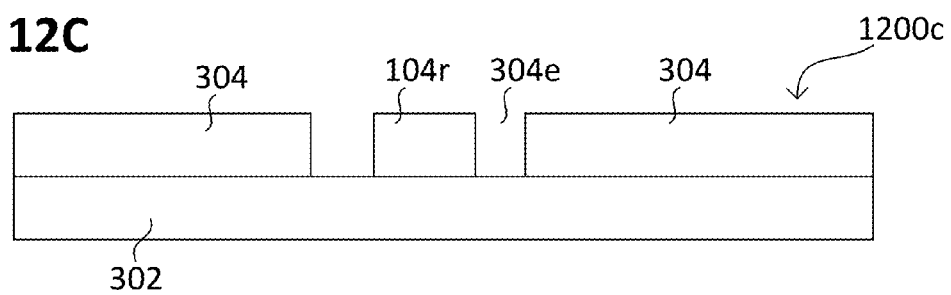
Figure 12D:
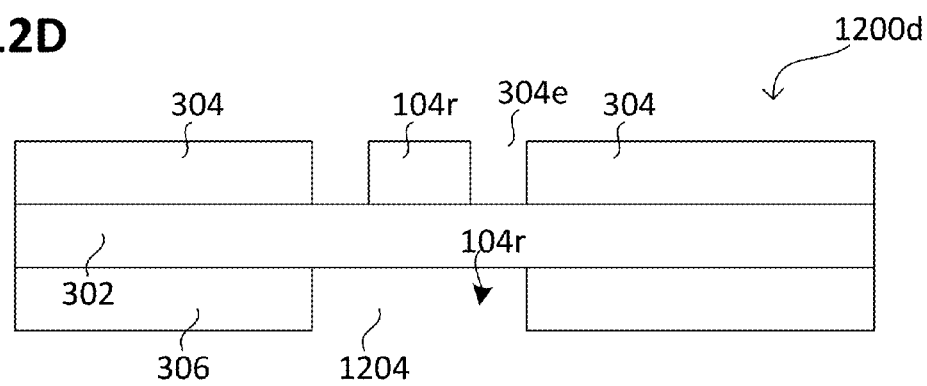

Thinning the chip contacting region (partially) may include opening the chip carrier to form at least one of: a recess opposite the at least one contact pad (see for example, FIG. 12D), an opening partially surrounding the at least one contact pad (see for example, FIG. 12D or FIG. 13A), a recess exposing the at least one contact pad (see for example, FIG. 11D or FIG. 13B). The recess exposing the at least one contact pad may extend through the first metallization and the base layer (see for example, FIG. 11D). Alternatively or additionally, the recess exposing the at least one contact pad may extend through a spacer layer (see for example, FIG. 13B). The recess opposite the at least one contact pad may extend through the first metallization (see for example, FIG. 12D). The opening partially surrounding the at least one contact pad may extend through the first metallization (see for example, FIG. 12D, FIG. 13B, FIG. 4C). Opening the chip carrier may include opening (or structuring) at least one of: the first metallization, the second metallization, the base layer.

Optionally, the method may include thinning the chip carrier in at least the chip contacting region and the chip supporting region, e.g. the complete chip carrier, e.g. prior to thinning the chip contacting region (itself). In other words, the method may include an two-step thinning process, including a first thinning step in which the semiconductor carrier is thinned in at least the chip contacting region and the chip supporting region, and a second thinning step in which the semiconductor carrier is thinned in the chip contacting region without thinning the chip supporting region.

Thinning the chip carrier in at least the chip contacting region and the chip supporting region may define the second thickness. For example, thinning the chip carrier in at least the chip contacting region and the chip supporting region may include thinning at least one of the first metallization or the second metallization. Thinning the chip carrier in at least the chip contacting region and the chip supporting region may facilitate thinning the chip contacting region (in a second process step), e.g. opening the chip carrier.

Thinning the chip carrier in at least one of the chip contacting region and the chip supporting region (in other words, thinning the chip carrier in at least the chip contacting region and the chip supporting region or thinning the chip carrier in the chip contacting region) may include at least one of etching the chip carrier, ablating the chip carrier using laser.

According to various embodiments, thinning the chip contacting region (e.g. by opening the chip carrier may) may include using a photolithographic process. For example, the photolithographic process may include forming a mask structure (e.g. a layer including one or more openings extending through the layer) on the chip carrier (e.g. at least one of over the first side and over the second side). The mask structure may include or formed from a resist, e.g. a photoresist. Alternatively or additionally, the photolithographic process may include irradiating the mask structure (e.g. exposing the mask structure to light). Alternatively or additionally, the photolithographic process may include etching the chip carrier (e.g. at least one of the first metallization and the second metallization), e.g. using the mask structure, to open the chip carrier.

According to various embodiments, a method (see for example, FIG. 11D, FIG. 12D, FIG. 13B, FIG. 13C, FIG. 13D) may include in an optional step: forming one or more metal layers (e.g. one or more electrodeposited metal layer) over the chip carrier, e.g. after thinning the chip carrier (e.g. in at least one of the chip contacting region and the chip supporting region), e.g. after thinning the chip contacting region. The one or more metal layers may include at least one of a layer including or formed from nickel, a layer including or formed from at least one of gold of palladium, a layer including or formed from copper.

A thickness of the one or more metal layers or at least one metal layer of the one or more metal layers may be in a range from about 1 nm to about 1 μm, e.g. in the range from about 10 nm about to 100 nm, e.g. about 20 nm. Forming the one or more metal layers may for example, include using electroplating.

Further, various embodiments will be described in the following.

1. A chip carrier including:
  a chip supporting region configured to support a chip;
  a chip contacting region including at least one contact pad for electrically contacting the chip;
  wherein the chip carrier is thinned in the chip contacting region such that a first thickness of the chip carrier at the at least one contact pad is smaller than a second thickness of the chip carrier in the chip supporting region.

2. The chip carrier of clause 1,
  wherein the at least one contact pad defines a contact surface at which the chip is physically contacted;
  wherein the chip supporting region defines a first support surface for supporting the chip and a second support surface for supporting the chip supporting region when the chip is received; and
  wherein the chip contacting region defines a third support surface for supporting the chip contacting region when the chip is received.

3. The chip carrier of clause 2,
  wherein at least one of the contact surface or the third support surface is disposed between the first support surface and the second support surface, such that a distance between the contact surface and the third support surface is smaller than a distance between the first support surface and the second support surface.

4. The chip carrier of one of the clauses 2 or 3,
  wherein the second support surface is substantially parallel to at least one of the contact surface, the third support surface and the first support surface.

5. The chip carrier of one of the clauses 2 to 4,
wherein a distance between the contact surface and the third support surface defines the first thickness.
6. The chip carrier of one of the clauses 2 to 5,
wherein a distance between the first support surface and the second support surface defines the second thickness.
7. The chip carrier of one of the clauses 2 to 6, further including:
wherein at least one of the contact surface or the third support surface is disposed between the first support surface and the second support surface, such that a distance between the contact surface and the third support surface is smaller than a distance between the first support surface and the second support surface.
8. The chip carrier of one of the clauses 2 to 7,
wherein at least one of the contact surface and the first support surface, or the second support surface and the third support surface are coplanar.
9. The chip carrier of one of the clauses 1 to 8, further including:
a recess in the chip contacting region overlapping the at least one contact pad.
10. The chip carrier clause 9,
wherein the at least one contact pad is:
at least one of disposed in or at least partially exposed by the recess; or disposed opposite the recess.
11. The chip carrier of one of the clauses 9 to 10,
wherein the chip carrier is configured to receive the chip on a side of the chip carrier on which the recess is formed, if the at least one contact pad is disposed in or exposed by the recess;
12. The chip carrier of clause 9 or 10,
wherein the chip carrier is configured to receive the chip on a side of the chip carrier opposite the recess, if the at least one contact pad is disposed opposite the recess.
13. The chip carrier of one of the clauses 1 to 12, further including:
a separator structure surrounding the chip supporting region at least partially, such that the chip supporting region can be displaced in response to a mechanical load.
14. The chip carrier of clause 13,
wherein the separator structure is formed on at least one of a first side of the chip carrier or a second side of the chip carrier opposite the first side; or
wherein the separator structure extends through the chip carrier.
15. The chip carrier of one of the clauses 1 to 14, further including:
at least one circuit structure which is electrically connected to the at least one contact pad.
16. The chip carrier of clause 15,
wherein the at least one circuit structure is formed on at least one of:
a side of the chip carrier on which the at least one contact pad is exposed; or
a side of the chip opposite the exposed side of the at least one contact pad.
17. The chip carrier of one of the clauses 1 to 16, further including:
a first metallization which is structured to form the at least one contact pad.
18. The chip carrier of clause 17,
wherein the first metallization is structured to form at least one of:
a circuit structure;
a separator structure.
19. The chip carrier of one of the clauses 1 to 18, further including:
a second metallization opposite the at least one contact pad.
20. The chip carrier of clause 19,
wherein the second metallization is structured to form at least one of:
a circuit structure;
a separator structure.
21. The chip carrier of clause 19 or 20,
wherein the second metallization is opened in the chip contacting region to provide a recess in the chip carrier; wherein the at least one contact pad is:
disposed opposite the recess; or
exposed by the recess.
22. The chip carrier of one of the clauses 1 to 21, further including:
a trench in the chip contacting region, wherein the trench partially surrounds the at least one contact pad.
23. The chip carrier of one of the clauses 1 to 22, further including:
an electrically insulating base layer over which at least one of the following is formed:
the at least one contact pad on a first side of the chip carrier;
a first metallization on a first side of the chip carrier;
a second metallization on a second side of the chip carrier.
24. The chip carrier of clause 23,
wherein the base layer is opened in the chip contacting region to provide a recess in the chip carrier; wherein the at least one contact pad is at least one of disposed in or at least partially exposed by the recess.
25. The chip carrier of clause 23,
a recess opposite the at least one contact pad, wherein the base layer is exposed by the recess.
26. The chip carrier of one of the clauses 13 or 14 and of one of the clauses 23 to 25,
wherein the base layer is exposed by the separator structure.
27. The chip carrier of clause 22 and one of the clauses 23 to 25,
wherein the separator structure extends through the base layer.
28. The chip carrier of clause 22 and one of the clauses 23 to 27,
wherein the base layer is exposed by the trench.
29. The chip carrier of one of the clauses 23 to 28,
wherein the base layer includes a polymer.
30. The chip carrier of one of the clauses 23 to 29,
wherein the base layer includes at least one of an elastomer; a thermoplastic.
31. The chip carrier of one of the clauses 23 to 30,
wherein the base layer is a foil.
32. The chip carrier of one of the clauses 1 to 31, further including:
an electrically insulating spacer layer in at least the chip supporting region for mounting a chip over the spacer layer, wherein the spacer layer is opened to provide a recess in the chip carrier, wherein the at least one contact pad is at least one of disposed in or at least partially exposed by the recess.
33. The chip carrier of clause 32,
wherein the spacer layer includes defines a first support surface.
34. The chip carrier of clause 32 or 33, wherein the spacer layer is formed conformal or nonconformal over at least one of the chip contacting region and the chip supporting region.

35. The chip carrier of one of the clauses 32 to 34, wherein the spacer layer partially covers the at least one contact pad.

36. The chip carrier of one of the clauses 32 to 35, wherein the spacer layer includes a solder stop material.

37. The chip carrier of one of the clauses 32 to 36, wherein the spacer layer includes a polymer.

38. The chip carrier of one of the clauses 32 to 37, wherein the spacer layer includes a resin.

39. The chip carrier of one of the clauses 32 to 38, wherein the spacer layer includes an adhesive.

40. The chip carrier of one of the clauses 32 to 39, wherein the spacer layer includes an oxide material.

41. The chip carrier of one of the clauses 32 to 40, wherein the spacer layer includes spacer particles.

42. The chip carrier of one of the clauses 1 to 41, wherein the at least one contact pad includes at least two contact pads.

43. The chip carrier of one of the clauses 1 to 42, wherein the at least two contact pads can be displaced in response to a mechanical load from at least one of: each other; the chip supporting region.

44. The chip carrier of one of the clauses 1 to 43, further including at least one of:
a laminate including at least one of:
an electrically insulating base layer;
a first metallization over the base layer on a first side of the chip carrier;
a second metallization over the base layer on a second side of the chip carrier; or
a lead frame.

45. A device, including:
chip carrier, including:
a chip supporting region configured to support a chip;
a chip contacting region including at least one contact pad for electrically contacting the chip;
wherein the chip carrier is thinned in the chip contacting region such that a first thickness of the chip carrier at the at least one contact pad is smaller than a second thickness of the chip carrier in the chip supporting region; and a chip, including:
at least one contact protrusion;
wherein the chip is received over the chip carrier such that the at least one contact protrusion extends at least partially into the chip contacting region and is electrically contacted by the at least one contact pad.

46. The device of clause 45,
wherein the at least one contact protrusion includes a protrusion height;
wherein a difference between the first thickness and the second thickness is smaller than the protrusion height.

47. The device of clause 45 or 46,
an adhesive material disposed between the chip and the chip carrier configured to adhere the chip to the chip supporting region, wherein a layer thickness of the adhesive material between the chip and the chip supporting region is substantially homogeneous along a path following the perimeter of the chip.

48. The device of clause 46 and 47,
wherein a sum of the first thickness and the protrusion height substantially equals a sum of the second thickness and the layer thickness of the adhesive layer.

49. The device of one of the clauses 45 to 48,
wherein the chip carrier is deformed such that a recess is formed in the chip contact region (e.g. on the first side); and
wherein the at least one contact protrusion of the chip extends at least partially into the recess such that the chip is aligned substantially parallel to the chip supporting region.

50. The device of one of the clauses 45 to 48,
wherein the at least one contact pad is disposed in or exposed by a recess of the chip carrier; and
wherein the at least one contact protrusion of the chip extends at least partially into the recess such that the chip is aligned substantially parallel to the chip supporting region.

51. The device of one of the clauses 46 to 50,
wherein the chip carrier is further configured to of one of the clauses 2 to 44.

52. A method, including:
providing chip carrier, the chip carrier including:
a chip supporting region configured to support a chip;
a chip contacting region including at least one contact pad for electrically contacting the chip;
wherein the chip carrier is thinned in the chip contacting region such that a first thickness of the chip carrier at the at least one contact pad is smaller than a second thickness of the chip carrier in the chip supporting region;
disposing a chip including at least one contact protrusion over the chip carrier, such that the at least one contact protrusion is arranged over the at least one contact pad;
pressing the chip against the chip carrier such that the at least one contact protrusion extends at least partially into the chip contacting region and is electrically contacted to the at least one contact pad.

53. The method of clause 52,
wherein pressing the chip against the chip carrier is based on at least one of:
a difference between the first thickness and the second thickness;
a protrusion height of the at least one contact protrusion.

54. The method of clause 52 or 53,
wherein pressing the chip against the chip carrier includes transferring a pressing force to the chip, wherein the pressing force is based on a difference between the first thickness and the second thickness.

55. The method of one of the clauses 52 to 54
wherein providing the chip carrier includes disposing the chip carrier on a first support element; and
wherein pressing the chip against the chip carrier includes applying a second support element to the chip for transferring a pressing force to the chip.

56. The method of one of the clauses 52 to 55,
wherein pressing the chip against the chip carrier includes aligning the chip substantially parallel to the chip supporting region.

57. The method of one of the clauses 52 to 56, further including:
disposing an adhesive material at least between the chip supporting region and the chip.

58. The method of clause 57,
wherein pressing the chip against the chip carrier includes transferring thermal energy to the adhesive material for heating the adhesive material.

59. The method clause 57 or 58,
wherein pressing the chip against the chip carrier includes forming a layer thickness of the adhesive material between the chip and the chip supporting region being substantially homogeneous along a path following the perimeter of the chip.

60. The method of clause 59,
wherein a sum of the first thickness and the protrusion height substantially equals a sum of the second thickness and the layer thickness of the adhesive material.

61. The method of one of the clauses 57 to 60,
wherein the pressing the chip against the chip carrier is based on viscosity of the adhesive material.

62. The method of one of the clauses 57 to 61,
wherein the adhesive material includes filler particles.

63. The method of clause 62,
wherein the pressing the chip against the chip carrier is based on a size of the filler particles.

64. The method of one of the clauses 52 to 63,
wherein pressing the chip against the chip carrier includes moving the at least one contact protrusion of the chip at least partially into a recess, wherein the at least one contact pad is at least one of disposed in or at least partially exposed by the recess, such that the chip is aligned substantially parallel to the chip supporting region.

65. The method of clause 64,
wherein pressing the chip against the chip carrier includes displacing the at least one contact pad by deforming the chip carrier to form the recess facing the chip for receiving the at least one contact protrusion.

66. The method of one of the clauses 52 to 65,
wherein the chip carrier is further configured to of one of the clauses 2 to 44.

67. A method, including:
forming at least one contact pad in a chip contacting region of a chip carrier for electrically contacting a chip;
forming a chip supporting region configured to support a chip;
thinning the chip contacting region partially such that a first thickness of the chip carrier at the at least one contact pad is smaller than a second thickness of the chip carrier in the chip supporting region.

68. The method of clause 67,
wherein thinning the chip contacting region includes forming a recess in the chip carrier opposite the at least one contact pad.

69. The method of clause 67,
wherein thinning the chip contacting region includes forming a recess in the chip carrier, wherein the at least one contact pad is at least one of formed in or at least partially exposed by the recess.

70. The method of one of the clauses 67 to 79,
wherein thinning the chip contacting region includes forming a recess in at least one of: a base layer of the chip carrier, a metallization of the chip carrier.

71. The method of one of the clauses 67 to 70,
wherein thinning the chip contacting region includes etching the chip carrier.

72. The method of one of the clauses 67 to 71,
wherein thinning the chip contacting region includes plastically deforming the chip carrier prior to disposing a chip over the chip carrier.

73. The method of one of the clauses 67 to 72,
wherein forming at least one contact pad includes punching the chip carrier.

74. The method of one of the clauses 67 to 73,
wherein thinning the chip contacting region includes forming an opening into a base layer of the chip carrier; forming a metallization layer in the chip contacting region which covers the opening to provide a recess of the chip carrier.

75. The method of one of the clauses 67 to 74,
wherein forming the at least one contact pad includes forming a metallization in the chip contacting region; and structuring the metallization layer to form the at least one contact pad.

76. The method of one of the clauses 67 to 75,
wherein thinning the chip contacting region includes forming a second metallization opposite the at least one contact pad; and opening the second metallization partially to form a recess.

77. A chip carrier, including:
a chip supporting region configured to support a chip.
a chip contacting region, including at least one contact pad for electrically contacting the chip;
a connection region between the chip contacting region and the chip supporting region so that the chip contacting region is movably supported by the chip supporting region via the connection region.

78. A chip carrier, including:
a chip supporting region configured to support a chip;
a chip contacting region, comprising at least one contact pad for electrically contacting the chip;
a connection region between the chip contacting region and the chip supporting region so that the chip contacting region is resiliently supported by the chip supporting region via the connection region 79. The chip carrier of clause 77 or 78,
wherein the chip carrier is thinned in the chip contacting region such that a first thickness of the chip carrier at the at least one contact pad is smaller than a second thickness of the chip carrier in the chip supporting region.

80. The chip carrier of one of the clauses 77 to 79,
wherein a third thickness of the chip carrier in the connection region is smaller than the first thickness of the chip carrier at the at least one contact pad.

81. The chip carrier of one of the clauses 77 to 80, further including:
a base layer which is completely exposed in at least the connection region.

82. The chip carrier of one of the clauses 77 to 81,
wherein a stress/strain ratio of the chip carrier in the chip supporting region is greater than in the connection region.

83. The chip carrier of one of the clauses 77 to 82,
wherein the chip carrier is free of a metal in the connection region.

84. A chip carrier, including:
a chip supporting region configured to support a chip;
a chip contacting region, including at least one contact pad for electrically contacting the chip;
a recess in the contacting region for receiving at least one contact protrusion of the chip, wherein the at least one contact pad is disposed in or exposed by the recess.

85. The chip carrier of clause 84, further including:
a base layer, wherein the recess extends through the base layer.

86. The chip carrier of clause 84 or 85, further including:
a spacer layer, wherein the recess extends through the base layer.

87. The chip carrier of one of the clauses 84 to 86, further including:
a metallization, wherein the recess extends through the metallization.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip carrier, comprising:
a chip supporting region configured to support a chip;
a chip contacting region comprising at least one contact pad for electrically contacting the chip;
a first metallization including the at least one contact pad,
wherein the chip carrier is thinner in the chip contacting region such that a first thickness of the chip carrier at the at least one contact pad is smaller than a second thickness of the chip carrier in the chip supporting region.

2. The chip carrier of claim 1,
wherein the chip contacting region defines a recess overlapping the at least one contact pad.

3. The chip carrier of claim 2,
wherein the at least one contact pad is:
at least one of disposed in or at least partially exposed by the recess; or
disposed opposite the recess.

4. The chip carrier of claim 1, further comprising:
at least one circuit structure which is electrically connected to the at least one contact pad.

5. The chip carrier of claim 1,
wherein the first metallization includes at least one of:
a circuit structure; or
a separator structure.

6. The chip carrier of claim 1, further comprising:
a second metallization disposed opposite the at least one contact pad.

7. The chip carrier of claim 6,
wherein the second metallization includes at least one of:
a circuit structure; or
a separator structure.

8. The chip carrier of claim 6,
wherein the second metallization defines a recess in the chip contacting region of the chip carrier;
wherein the at least one contact pad is:
disposed opposite the recess; or
partially exposed by the recess.

9. The chip carrier of claim 1, further comprising:
an electrically insulating spacer layer in at least the chip supporting region for mounting the chip over the spacer layer,
wherein the spacer layer defines a recess in the chip carrier, wherein the at least one contact pad is at least one of disposed in or at least partially exposed by the recess.

10. The chip carrier of claim 9,
wherein the spacer layer comprises a solder stop material.

11. The method of claim 1,
wherein the chip contacting region defines a trench that partially surrounds the at least one contact pad.

12. The method of claim 1,
wherein the at least one contact pad includes at least two contact pads, and
the at least two contact pads are configured to be displaced in response to a mechanical load.

13. A device, comprising:
a chip carrier, comprising:
a chip supporting region configured to support a chip;
a chip contacting region comprising at least one contact pad for electrically contacting the chip;
wherein the chip carrier is thinner in the chip contacting region such that a first thickness of the chip carrier at the at least one contact pad is smaller than a second thickness of the chip carrier in the chip supporting region, and
the chip carrier is configured to define a recess when the chip carrier is deformed; and
the chip, comprising:
at least one contact protrusion;
wherein the chip is configured to be disposed over the chip carrier such that the at least one contact protrusion extends at least partially into the chip contacting region and is electrically contacted by the at least one contact pad, and
the at least one contact protrusion of the chip is configured to extend at least partially into the recess such that the chip is aligned substantially parallel to the chip supporting region.

14. The device of claim 13,
wherein the at least one contact protrusion comprises a protrusion height;
wherein a difference between the first thickness and the second thickness is smaller than the protrusion height.

15. The device of claim 14, further comprising:
an adhesive material disposed between the chip and the chip carrier, the adhesive material being configured to adhere the chip to the chip supporting region,
wherein a layer thickness of the adhesive material between the chip and the chip supporting region is substantially homogeneous along a path following the perimeter of the chip.

16. The device of claim 15,
wherein a sum of the first thickness and the protrusion height substantially equals a sum of the second thickness and the layer thickness of the adhesive material.

17. The device of claim 13,
wherein the at least one contact pad is disposed in or partially exposed by the recess of the chip carrier.

* * * * *